United States Patent
Roth et al.

(10) Patent No.: US 9,312,246 B2
(45) Date of Patent: Apr. 12, 2016

(54) LIGHT EMITTING DEVICE AND LIGHTING SYSTEM HAVING THE SAME

(75) Inventors: Gundula Roth, Levenhagen (DE); Walter Tews, Greifswald (DE); Chung-Hoon Lee, Ansan (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 13/279,878

(22) Filed: Oct. 24, 2011

(65) Prior Publication Data

US 2012/0037933 A1    Feb. 16, 2012

Related U.S. Application Data

(62) Division of application No. 12/295,438, filed as application No. PCT/KR2007/001587 on Mar. 31, 2007.

(30) Foreign Application Priority Data

Mar. 31, 2006    (KR) .................. 10-2006-0029517

(51) Int. Cl.
*H01J 1/62* (2006.01)
*H01L 25/075* (2006.01)
(Continued)

(52) U.S. Cl.
CPC ........ *H01L 25/0753* (2013.01); *C09K 11/7734* (2013.01); *C09K 11/7735* (2013.01); *C09K 11/7738* (2013.01); *H05B 33/0821* (2013.01); *H05B 33/0842* (2013.01); *H05B 33/0857* (2013.01); *H05B 33/14* (2013.01); *H05B 37/0281* (2013.01); *F21K 9/00* (2013.01);
(Continued)

(58) Field of Classification Search
USPC ......................................... 362/240
See application file for complete search history.

(56) References Cited

U.S. PATENT DOCUMENTS

| | | |
|---|---|---|
| 2,110,162 A | 3/1938 | Leverenz |
| 2,402,760 A | 6/1946 | Leverenz |

(Continued)

FOREIGN PATENT DOCUMENTS

| | | |
|---|---|---|
| AT | 410266 | 3/2003 |
| CN | 1218084 | 6/1999 |

(Continued)

OTHER PUBLICATIONS

International Search Report dated Jul. 12, 2007 for PCT Application No. PCT/KR2007/001587.

(Continued)

*Primary Examiner* — Andrew Coughlin
(74) *Attorney, Agent, or Firm* — H.C. Park & Associates, PLC

(57) ABSTRACT

The present invention provides a light emitting device comprising a first light emitting portion that emits white light at a color temperature of 6000K or more and a second light emitting portion that emits white light at a color temperature of 3000K or less, which include light emitting diode chips and phosphors and are independently driven. The present invention has an advantage in that a light emitting device can be diversely applied in a desired atmosphere and use by realizing white light with different light spectrums and color temperatures. Particularly, the present invention has the effect on health by adjusting the wavelength of light or the color temperature according to the circadian rhythm of humans.

15 Claims, 8 Drawing Sheets

(51) Int. Cl.

| | |
|---|---|
| *C09K 11/77* | (2006.01) |
| *H05B 33/08* | (2006.01) |
| *H05B 33/14* | (2006.01) |
| *H05B 37/02* | (2006.01) |
| *F21K 99/00* | (2010.01) |
| *H01L 33/50* | (2010.01) |

(52) U.S. Cl.
CPC ......... *H01L33/50* (2013.01); *H01L 2924/0002* (2013.01); *Y02B 20/181* (2013.01); *Y02B 20/42* (2013.01)

(56) References Cited

U.S. PATENT DOCUMENTS

| | | | |
|---|---|---|---|
| 2,570,136 A | 10/1951 | Lyon | |
| 2,617,773 A | 11/1952 | Nagy et al. | |
| 2,719,128 A | 9/1955 | Kressin | |
| 2,780,600 A | 2/1957 | Wollentin | |
| 3,143,510 A | 8/1964 | Wanmaker et al. | |
| 3,598,752 A | 8/1971 | Sisneros | |
| 3,644,212 A | 2/1972 | McAllister et al. | |
| 3,893,939 A | 7/1975 | De Kalb et al. | |
| 3,905,911 A | 9/1975 | Kelsey, Jr. et al. | |
| 4,215,289 A | 7/1980 | De Hair et al. | |
| 4,770,950 A | 9/1988 | Ohnishi | |
| 4,810,416 A | 3/1989 | Hase | |
| 4,972,086 A | 11/1990 | Bryan et al. | |
| 5,032,316 A | 7/1991 | Takahashi et al. | |
| 5,188,763 A | 2/1993 | Chenot et al. | |
| 5,433,295 A | 7/1995 | Murphy | |
| 5,472,636 A | 12/1995 | Forster et al. | |
| 5,518,808 A | 5/1996 | Bruno et al. | |
| 5,770,110 A | 6/1998 | Schrell et al. | |
| 5,770,111 A | 6/1998 | Moriyama et al. | |
| 5,853,614 A | 12/1998 | Hao et al. | |
| 5,952,681 A | 9/1999 | Chen | |
| 5,965,192 A | 10/1999 | Potter | |
| 5,998,925 A | 12/1999 | Shimizu et al. | |
| 6,045,722 A | 4/2000 | Leblans et al. | |
| 6,066,861 A | 5/2000 | Hohn et al. | |
| 6,084,250 A | 7/2000 | Justel et al. | |
| 6,373,184 B1 | 4/2002 | Suh et al. | |
| 6,472,765 B1 | 10/2002 | Sano et al. | |
| 6,482,664 B1 | 11/2002 | Lee et al. | |
| 6,565,771 B1 | 5/2003 | Ono et al. | |
| 6,670,751 B2 | 12/2003 | Song et al. | |
| 6,686,691 B1 | 2/2004 | Mueller et al. | |
| 6,842,664 B2 | 1/2005 | Harada et al. | |
| 6,982,045 B2 | 1/2006 | Menkara et al. | |
| 6,982,048 B1 | 1/2006 | Atwater et al. | |
| 6,987,353 B1 | 1/2006 | Menkara et al. | |
| 7,019,335 B2 | 3/2006 | Suenaga | |
| 7,029,602 B2 | 4/2006 | Oshio | |
| 7,045,078 B2 | 5/2006 | Choi | |
| 7,138,770 B2 | 11/2006 | Uang et al. | |
| 7,189,340 B2 | 3/2007 | Shimomura et al. | |
| 7,204,607 B2 | 4/2007 | Yano | |
| 7,206,507 B2 | 4/2007 | Lee et al. | |
| 7,229,571 B2 | 6/2007 | Ezuhara et al. | |
| 7,244,965 B2 | 7/2007 | Andrews et al. | |
| 7,332,746 B1 | 2/2008 | Takahashi et al. | |
| 7,468,147 B2 | 12/2008 | Shida et al. | |
| 7,554,129 B2 | 6/2009 | Roth et al. | |
| 7,608,200 B2 | 10/2009 | Seto et al. | |
| 7,679,101 B2 | 3/2010 | Ota et al. | |
| 7,679,281 B2 | 3/2010 | Kim et al. | |
| 8,066,909 B2 | 11/2011 | Roth et al. | |
| 8,070,983 B2 | 12/2011 | Roth et al. | |
| 8,070,984 B2 | 12/2011 | Roth et al. | |
| 8,089,084 B2 | 1/2012 | Roth et al. | |
| 2002/0015013 A1 | 2/2002 | Ragle | |
| 2002/0070681 A1* | 6/2002 | Shimizu et al. ............... 315/246 |
| 2002/0130326 A1* | 9/2002 | Tamura et al. .................. 257/79 |
| 2003/0026096 A1 | 2/2003 | Ellens et al. | |
| 2003/0030063 A1 | 2/2003 | Sosniak et al. | |
| 2003/0038295 A1 | 2/2003 | Koda | |
| 2003/0141510 A1* | 7/2003 | Brunner ............... H01L 33/486 257/81 |
| 2003/0168636 A1 | 9/2003 | Dobson et al. | |
| 2004/0051111 A1 | 3/2004 | Ota et al. | |
| 2004/0079957 A1 | 4/2004 | Andrews et al. | |
| 2004/0104391 A1 | 6/2004 | Maeda et al. | |
| 2004/0135504 A1 | 7/2004 | Tamaki et al. | |
| 2004/0136891 A1 | 7/2004 | Kijima et al. | |
| 2004/0206970 A1 | 10/2004 | Martin | |
| 2004/0217364 A1* | 11/2004 | Tarsa et al. ....................... 257/89 |
| 2004/0251809 A1 | 12/2004 | Shimomura et al. | |
| 2005/0001225 A1 | 1/2005 | Yoshimura et al. | |
| 2005/0001537 A1 | 1/2005 | West et al. | |
| 2005/0029927 A1 | 2/2005 | Setlur et al. | |
| 2005/0030744 A1 | 2/2005 | Ducharme et al. | |
| 2005/0117334 A1 | 6/2005 | Lee et al. | |
| 2005/0139846 A1 | 6/2005 | Park et al. | |
| 2005/0141048 A1 | 6/2005 | Mizutani | |
| 2005/0239227 A1 | 10/2005 | Aanegola et al. | |
| 2005/0264161 A1 | 12/2005 | Oaku et al. | |
| 2005/0274930 A1 | 12/2005 | Roth et al. | |
| 2005/0274972 A1 | 12/2005 | Roth et al. | |
| 2006/0043879 A1* | 3/2006 | Naitou .......................... 313/501 |
| 2006/0076883 A1 | 4/2006 | Himaki et al. | |
| 2006/0086311 A1 | 4/2006 | Zagumennyi et al. | |
| 2006/0158090 A1 | 7/2006 | Wang et al. | |
| 2006/0261309 A1 | 11/2006 | Li et al. | |
| 2006/0261350 A1 | 11/2006 | Kawazoe et al. | |
| 2006/0267042 A1 | 11/2006 | Izuno et al. | |
| 2007/0029526 A1 | 2/2007 | Cheng et al. | |
| 2007/0247051 A1 | 10/2007 | Kuze et al. | |
| 2007/0284563 A1 | 12/2007 | Lee et al. | |
| 2008/0036364 A1 | 2/2008 | Li et al. | |
| 2008/0067472 A1 | 3/2008 | Roth et al. | |
| 2008/0067920 A1 | 3/2008 | Roth et al. | |
| 2008/0224163 A1 | 9/2008 | Roth et al. | |
| 2009/0050847 A1 | 2/2009 | Xu et al. | |
| 2009/0050849 A1 | 2/2009 | Lee et al. | |
| 2009/0134413 A1 | 5/2009 | Roth et al. | |
| 2009/0152496 A1 | 6/2009 | Roth et al. | |
| 2009/0262515 A1 | 10/2009 | Lee et al. | |
| 2009/0303694 A1 | 12/2009 | Roth et al. | |
| 2010/0002454 A1 | 1/2010 | Lee et al. | |
| 2010/0165645 A1 | 7/2010 | Lee et al. | |
| 2010/0207132 A1 | 8/2010 | Lee et al. | |

FOREIGN PATENT DOCUMENTS

| | | |
|---|---|---|
| CN | 1289454 | 3/2001 |
| CN | 1317537 | 10/2001 |
| CN | 1344777 | 4/2002 |
| CN | 1434521 | 8/2003 |
| CN | 2624578 | 7/2004 |
| CN | 1581503 | 2/2005 |
| CN | 2690724 | 4/2005 |
| CN | 1702809 | 11/2005 |
| CN | 1706043 | 12/2005 |
| CN | 1707819 | 12/2005 |
| DE | 10233050 | 2/2004 |
| DE | 10259946 | 7/2004 |
| EP | 0094132 | 11/1983 |
| EP | 0382295 | 8/1993 |
| EP | 0862794 | 9/1998 |
| EP | 0896994 | 2/1999 |
| EP | 1249873 | 10/2002 |
| EP | 1605030 | 12/2005 |
| EP | 2031038 | 3/2009 |
| GB | 1336053 | 11/1973 |
| GB | 2016034 | 9/1979 |
| JP | 31-1118 | 2/1956 |
| JP | 33-8177 | 9/1958 |
| JP | 38-6082 | 5/1963 |
| JP | 39-8803 | 5/1964 |
| JP | 47-6258 | 4/1972 |
| JP | 49-38994 | 10/1974 |
| JP | 55-135190 | 10/1980 |
| JP | 57-109886 | 7/1982 |

(56) References Cited

FOREIGN PATENT DOCUMENTS

| | | |
|---|---|---|
| JP | 61-258892 | 11/1986 |
| JP | 62-197487 | 9/1987 |
| JP | 03-228366 | 10/1991 |
| JP | 05-63070 | 3/1993 |
| JP | 5-78659 | 3/1993 |
| JP | 05-198843 | 8/1993 |
| JP | 9-40946 | 2/1997 |
| JP | 9-153644 | 6/1997 |
| JP | 9-279140 | 10/1997 |
| JP | 10-321914 | 12/1998 |
| JP | 11-177143 | 7/1999 |
| JP | 11-233730 | 8/1999 |
| JP | 2000-260580 | 9/2000 |
| JP | 2000-294387 | 10/2000 |
| JP | 2001-308393 | 11/2001 |
| JP | 2001-524163 | 11/2001 |
| JP | 2002-50795 | 2/2002 |
| JP | 2002-057376 | 2/2002 |
| JP | 2002-094122 | 3/2002 |
| JP | 2002-97465 | 4/2002 |
| JP | 2002-97466 | 4/2002 |
| JP | 2002-173677 | 6/2002 |
| JP | 2002-531956 | 9/2002 |
| JP | 2002-335019 | 11/2002 |
| JP | 2002-359403 | 12/2002 |
| JP | 2002-368277 | 12/2002 |
| JP | 2003-064358 | 3/2003 |
| JP | 2003-133595 | 5/2003 |
| JP | 2003-152229 | 5/2003 |
| JP | 2003-183649 | 7/2003 |
| JP | 2003-224306 | 8/2003 |
| JP | 2003-321675 | 11/2003 |
| JP | 2004-006582 | 1/2004 |
| JP | 2004-010786 | 1/2004 |
| JP | 2004-505470 | 2/2004 |
| JP | 2004-071726 | 3/2004 |
| JP | 2004-71807 | 3/2004 |
| JP | 2004-079867 | 3/2004 |
| JP | 2004-88011 | 3/2004 |
| JP | 2004-127988 | 4/2004 |
| JP | 2004-134699 | 4/2004 |
| JP | 2004-192833 | 7/2004 |
| JP | 2001-115157 | 12/2004 |
| JP | 2005-100799 | 4/2005 |
| JP | 2005-100800 | 4/2005 |
| JP | 2005-101296 | 4/2005 |
| JP | 2005-153606 | 6/2005 |
| JP | 2005-167177 | 6/2005 |
| JP | 2005-354027 | 12/2005 |
| JP | 2006-503431 | 1/2006 |
| JP | 2006-073656 | 3/2006 |
| JP | 2006-173433 | 6/2006 |
| JP | 2006-252944 | 9/2006 |
| JP | 2007-186674 | 7/2007 |
| JP | 2009-007545 | 1/2009 |
| KR | 10-232395 | 12/1999 |
| KR | 10-2001-0032450 | 4/2001 |
| KR | 10-2001-0050839 | 6/2001 |
| KR | 10-2001-0101910 | 11/2001 |
| KR | 10-2002-0000835 | 1/2002 |
| KR | 10-2002-0053975 | 7/2002 |
| KR | 10-0392363 | 7/2002 |
| KR | 10-2002-0079513 | 10/2002 |
| KR | 10-2003-0063211 | 7/2003 |
| KR | 10-2003-0082395 | 10/2003 |
| KR | 10-0426034 | 7/2004 |
| KR | 10-2004-0088418 | 10/2004 |
| KR | 10-2005-0008426 | 1/2005 |
| KR | 10-2005-0070349 | 7/2005 |
| KR | 10-2005-0098462 | 10/2005 |
| KR | 10-2005-0106945 | 11/2005 |
| KR | 10-2005-0117164 | 12/2005 |
| KR | 10-2006-0034056 | 4/2006 |
| KR | 10-0626272 | 9/2006 |
| KR | 10-2006-0117165 | 11/2006 |
| KR | 10-2006-0134728 | 12/2006 |
| KR | 10-2007-0016900 | 2/2007 |
| KR | 10-2007-0050833 | 5/2007 |
| KR | 10-2007-0084659 | 8/2007 |
| KR | 10-2007-0086483 | 8/2007 |
| KR | 10-2008-0046789 | 5/2008 |
| KR | 10-2008-0074241 | 7/2008 |
| KR | 10-2008-0075181 | 7/2008 |
| TW | I328885 | 3/1999 |
| TW | 546854 | 8/2003 |
| WO | 96-32457 | 10/1996 |
| WO | 98-05078 | 2/1998 |
| WO | 98-12757 | 3/1998 |
| WO | 98-39805 | 9/1998 |
| WO | 98-42798 | 10/1998 |
| WO | 00-19546 | 4/2000 |
| WO | 00/33390 | 6/2000 |
| WO | 01-41215 | 6/2001 |
| WO | 02-054502 | 7/2002 |
| WO | 02-054503 | 7/2002 |
| WO | 02-089219 | 11/2002 |
| WO | 03-021691 | 3/2003 |
| WO | 2003/030274 | 4/2003 |
| WO | 2004/036962 | 4/2004 |
| WO | 2004-085570 | 10/2004 |
| WO | 2004100275 | 11/2004 |
| WO | 2004-111156 | 12/2004 |
| WO | 2005-068584 | 7/2005 |
| WO | 2005-112137 | 11/2005 |
| WO | 2005109532 | 11/2005 |
| WO | 2006-043682 | 4/2006 |
| WO | 2006-068359 | 6/2006 |
| WO | 2006-081803 | 8/2006 |
| WO | 2006/109659 | 10/2006 |
| WO | 2007-035026 | 3/2007 |
| WO | 2007/055538 | 5/2007 |
| WO | 2007-055538 | 5/2007 |
| WO | 2007055538 | 5/2007 |
| WO | 2007/069869 | 6/2007 |
| WO | 2007-069869 | 6/2007 |
| WO | 2007-114614 | 11/2007 |
| WO | 2009028818 | 3/2009 |

OTHER PUBLICATIONS

International Search Report dated Mar. 21, 2007 for PCT Application No. PCT/KR2006/005500.

International Search Report dated Feb. 20, 2007 for PCT Application No. PCT/KR2006/004716.

International Search Report dated Oct. 24, 2005 for PCT Application No. PCT/KR2005/002332.

International Search Report dated Oct. 13, 2005 for PCT Application No. PCT/KR2005/002333.

International Search Report dated Aug. 12, 2005 for PCT Application No. PCT/KR2005/001288.

International Search Report dated Aug. 12, 2005 for PCT Application No. PCT/KR2005/001287.

International Search Report dated Feb. 27, 2009 for PCT Application No. PCT/KR2008/004734.

International Search Report dated Feb. 11, 2009 for PCT Application No. PCT/KR2008/004733.

Joung Kyu Park, et al., "Silicate Phosphors for White LEDs Identified Through Combinatorial Chemistry", Electrochemical and Solid-State Letters, vol. 10(2), pp. J15-J18, (2007), XP-00251106706-11-12).

Joung Kyu Park, et al., "Luminescence Characteristics of Yellow Emitting Ba3SiO5:EU2+ Phosphor", Journal of Materials Science 40 (2005), pp. 2069-2071, XP-002511068.

Search Report dated Feb. 2, 2009 for EP Application No. EP08014684.

S.D. Jee, et al., "Photoluminescence properties of Eu2+-activated Sr3SiO5 Phosphors," J. Mater Sci. 41 (2006), pp. 3139-3141.

G. Blasse, et al., "Fluorescence of Europium2+-activated silicates," Philips Res. Repts 23 (1968), pp. 189-199.

G. Roth, et al. "Advanced Silicate Phosphors for improved white LED", Global Phosphor Summit Seoul/Korea, Mar. 5-7, 2007.

(56) References Cited

OTHER PUBLICATIONS

N.A. Toropov, et al "Inorganic and Analytical Chemistry-a Study of the Formation of Solid Solutions of Tristrontium Silicate . . . "published by Institute of Silicate Chemistry, Academy of Sciences of the USSR. pp. 1918-1921, submitted Aug. 21, 1962.
H.G. Kang, et al., "Embodiment and Luminescence Properties of Sr3SiO5:Eu(yellow-orange phosphor) by co-doping lanthanide", Solid State Phenomena, vol. 124-126 (2007) pp. 511-514.
T.L. Barry, "Fluorescence of Eu2+ Activated Phases in Binary Alkaline Earth Orthosilicate Systems", J. Electrochem Soc., Nov. 1968, pp. 1181-1184.
Notice of Allowance dated Dec. 1, 2008 issued in U.S. Appl. No. 11/024,702.
Chinese Office Action corresponding to Patent App No. 2005800150173 dated Dec. 28, 2007.
Final OA dated Oct. 22, 2007 issued in U.S. Appl. No. 11/024,722.
Office Action dated Dec. 28, 2007 corresponding to China App No. 200580016844.4.
X. W. Sun et al., "Pulsed Laser Deposition of Silicate Phosphor Thin Films", Appl. Phys. A 69, 1999, 5 pp.
W.L. Wanmaker et al. "Luminescence of Phosphors Based on the Host Lattice ABGe2O6 (A, B=Ca, Sr, Ba)" Journal of Solid State Chemistry 3, (1971), pp. 194-196.
Non-Final Office Action of U.S. Appl. No. 12/491,457 mailed on Nov. 17, 2011.
Non-Final OA mailed May 23, 2007 for U.S. Appl. No. 11/024,722 entitled "Luminescent Material".
Ageeth A. Bol et al., "Luminescence of ZnS:Cu2+", Journal of Luminescence, No. 99, 2002, pp. 325-334.
J.F. Suyver et al., "Luminescence of nanocrystalline ZnSe:Cu", Applied Physics Letters, vol. 79, No. 25, Dec. 17, 2001, pp. 4222-4224.
Ping Yang et al., "Photoluminescence of Cu+-doped and Cu2+-doped ZnS nanocrystallites", Journal of Physics and Chemistry of Solids, No. 63, 2002, pp. 638-643.
S. Shionoya et al., (Eds.), "Principal phosphor materials and their optical properties" in Phosphor Handbook, CRC Press, 1999, pp. 231-255.
A. Scacco et al., "Optical Spectra of Cu2+ Ions in LiF Crystals", Radiation Effects and Defects in Solids, vol. 134, 1995, pp. 333-336.
Lujcan Dubicki et al., "The First d-d Fluorescence of a Six-Coordinate Copper (II) Ion", J. Am. Chem. Soc. 1989, No. 111, pp. 3452, 3454.
A.B.P. Lever, "Inorganic Electronic Spectroscopy", 2nd ed., Elsevier, 1984, pp. 355 and 557-559.
A.G. Shenstone, "The Third Spectrum of Copper (Cu III)", Journal of Research of the National Bureau of Standards—A. Physics and Chemistry, vol. 79A, No. 3, May-Jun. 1975, pp. 497-521.
S. Shinoya et al. (Eds.), "Principal phosphor materials and their optical properties" in Phosphor Handbook, CRC Press, 1999, p. 826.
First Office Action of the PRC to Chinese Patent App No. 20051002304.2 dated Feb. 15, 2008.
Yang, "Up- Conversion Fluorescence in Er3 + Yb3 + Co- Doped Oxy—Fluoride Compound Materials Based on GeO2", Natural Science Journal of Xiangtan University, vol. 23, No. 2, 2001, pp. 37-41.
Bernhardt, Investigations of the Orange Luminescence of PbMo04 Crystals, Phys. Stat. Sol (a), 91, 643, 1985, pp. 643-647.
Butler, "Fluorescent Lamp Phosphors", The Pennsylvania State University Press, 1980, pp. 175-176.
Butler, "Fluorescent Lamp Phosphors", The Pennsylvania State University Press, 1980, pp. 181-182.
Wanmaker, Luminescence of Copper-Activated Orthophosphates of the Type ABPO (A=Ca, Sr, or Ba and B=Li, Na or K), Journal of the Electrochemical Society, pp. 109-113.
Butler, "Fluorescent Lamp Phosphors", The Pennsylvania State University Press, 1980, pp. 281-284.
"Phosphors for Mercury Lamps" https:/www.lamptech.co.uk/Docuemnts/M14%20Phosphors.htm 2003 (2 pages).
Blasse, "Radiationless Processes in Luminescent Materials", Radiationless Processes, 1980, pp. 287-289, 293.

Shinonoya, "Phosphor Handbook", edited under the auspice of Phosphor Research Society, CRC Press, 1999, pp. 204-205.
Shinonoya, "Phosphor Handbook", edited under the auspice of Phosphor Research Society, CRC Press, 1998, p. 238-239, 241.
Wanmaker, "Luminescence of Copper-Activated Calcium and Strontium Orthophosphates", Journal of the Electromagnetic Society, pp. 1027-1031, 1959.
van Gool, "Philips Res. Rept. Suppl." 3, 1, 1961, pp. 1-9, 30-51, 84-85.
Declaration Under Rule 37 CFR 1.132 of Ulrich Kynast dated Sep. 6, 2008.
G. Blasse, "Characteristic Luminescence", Philips Technical Review, vol. 31, 1970, pp. 304-332.
International Search Report for PCT/KR2010/003302 issued on Jan. 3, 2011, corresponding to U.S. Appl. No. 12/767,253.
Final Office Action dated Dec. 8, 2010 in U.S. Appl. No. 11/948,813.
Final Office Action dated Dec. 23, 2010 in U.S. Appl. No. 11/569,060.
Non Final Office Action dated Dec. 29, 2010 in U.S. Appl. No. 12/731,811.
Final Office Action dated Dec. 7, 2010 in U.S. Appl. No. 11/948,845.
Non Final Office Action dated Nov. 26, 2010 in U.S. Appl. No. 12/440,001.
Non Final Office Action dated Nov. 24, 2010 in U.S. Appl. No. 12/093,441.
Final Office Action dated Nov. 30, 2010 in U.S. Appl. No. 11/024,722.
Non Final Office Action dated Nov. 30, 2010 in U.S. Appl. No. 12/196,923.
Notice of Allowance dated Aug 18, 2010 in U.S. Appl. No. 12/098,263.
Final Office Action dated May 11, 2010 in U.S. Appl. No. 12/098,263.
Non Final Office Action dated Mar. 17, 2010 in U.S. Appl. No. 11/024,722.
Non Final Office Action dated Aug. 17, 2010 in U.S. Appl. No. 11/948,845.
EP Search Report dated Sep. 1, 2010 in EP Appl No. 08015119 corrresponding to U.S. Appl No. 12/440,001.
EP Search Report dated Oct. 6, 2010 in EP Appl No. 07745750.5—corresponding to U.S. Appl. No. 12/295,438.
Non Final Office Action dated Jun. 16, 2010 in U.S. Appl. No. 12/097,741.
Final Office Action dated Nov. 12, 2010 in U.S. Appl. No. 12/097,741.
Non-Final Office Action dated Aug. 10, 2010 in U.S. Appl. No. 11/024,722.
Final Office Action dated Jun. 21, 2010 in U.S. Appl. No. 11/569,060.
Non-Final Office Action dated Apr. 30, 2010 in U.S. Appl. No. 11/568,769.
Final Office Action dated Sep. 9, 2010 in U.S. Appl. No. 11/568,769.
CN Office Action dated Feb. 5, 2010 in CN Appl. No. 2005100023042.
European Search Report of Oct. 26, 2010 in EP 10 17 7817, corresponding to U.S. Appl. No. 11/024,722.
Non-Final Office Action dated Aug. 18, 2010 in U.S. Appl. No. 11/948,813.
Non-Final Office Action dated Aug. 10, 2010 in U.S. Appl. No. 12/731,811.
IP Australia Office Action dated Jul. 2, 2010 for AU Patent Appl. No. 2005-319965, corresponding to U.S. Appl. No. 12/098,263.
TW Office Action of Sep. 10, 2010 in TW Patent Appl. No. 098123458.
European Search Report of Sep. 23, 2010 in European Patent Appl. No. 10 16 4970.
Non-final office action dated May 29, 2009 issued in U.S. Appl. No. 11/024,722, filed Dec. 30, 2004.
Notice of Allowance dated May 4, 2009 issued in U.S. Appl. No. 11/024,702.
Non-final office action dated Nov. 29, 2007 issued in U.S. Appl. No. 11/024,702, filed Dec. 30, 2004.
Non-final office action dated Aug. 12, 2009 issued in U.S. Appl. No. 11/569,060, filed Jun. 22, 2007.

(56) References Cited

OTHER PUBLICATIONS

Non-final office action dated Jan. 13, 2010 issued in U.S. Appl. No. 11/569,060, filed Jun. 22, 2007.
Non-final office action dated Nov. 17, 2009 issued in U.S. Appl. No. 12/097,741, filed Oct. 9, 2008.
Bogner et al., DE 102 33 050 A1, Feb. 5, 2004, Machine Traslation.
Final office action dated Feb. 7, 2007 issued in U.S. Appl. No. 11/024,702, filed Dec. 30, 2004.
Non-final office action dated Jun. 22, 2006 issued in U.S. Appl. No. 11/024,702, filed Dec. 30, 2004.
Non-final office action dated Nov. 29, 2006 issued in U.S. Appl. No. 11/024,722, filed Dec. 30, 2004.
Final office action dated Oct. 28, 2009 issued in U.S. Appl. No. 11/024,722, filed Dec. 30, 2004.
Non-final office action dated May 23, 2007 issued in U.S. Appl. No. 11/024,722, filed Dec. 30, 2004.
Non-final office action dated Nov. 14, 2008 issued in U.S. Appl. No. 11/024,722, filed Dec. 30, 2004.
Non-final office action dated Nov. 2, 2009 issued in U.S. Appl. No. 12/098,263.
Ralchenko, Yu., Kramida, A.E., Reader, J. and NIST ASD Team (2008). NIST Atomic Spectra Database (version 3.1.5), [Online]. Available: http://physics.nist.gov/asd3 [Feb. 27, 2009]. National Institute of Standards and Technology, Gaithersburg, MD.
N. S. Akhmetov, "Inorganic Chemistry", Moscow "Vysshaya Shkola", 1975; (partial translation; translated pp. 332-333, 372-373, 384-385, 427, 432, 436, 445, 471, 476, 486, 491, 496-497, 501, 546-549).
Markovsky L, Ya. Et al., Phosphors (Moscow-Leningrad, Khimiya Publishers, 1966, p. 7 (partial translation).
Search Report dated Apr. 11, 2006 for EP Application No. EP04106880.0.
Search Report dated Nov. 5, 2008 for EP Application No. EP06812549.1.
Search Report dated Aug. 21, 2007 for EP Application No. EP04106882.6.
International Search Report for PCT/KR2010/003285 issued on Jan. 24, 2011, corresponding to U.S. Appl. No. 12/773,514.
Feldmann C., "Inorganic Luminescent Materials: 100 Years of Research and Application", Adv. Funct. Matter, 2003, pp. 511-516.
G. Blasse, B.C. Grabmeier, "Luminescent Materials", Springer, 1994, 87-90.
B. Cordero, V. Gómez, A. E. Platero-Prats, M. Revés, J. Echeverría, E. Cremades, F. Barragán, and S. Alvarez, "Covalent radii revisted", Dalton Trans., (2008), pp. 2832-2838.
R.J. Angel et al., "Structure and twinning of single-crystal MgSiO3 garnet synthisized at 17 GPa and 1800 ° C.", American Minerologist, 74 (1989) pp. 509-512.
G.L. Miessler, D.A. Tarr, "Inorganic Chemistry", 3rd ed., Pearson / Prentice Hall, pp. 117-118 date unknown.
P.A. Cox, "Transition Metal Oxides", Oxford University Press, 1995, p. 105.
Garcia Solé, L.E. Bausá, D. Jaque, "An Introduction to the Optical Spectroscopy of Inorganic Solids", Wiley, 2005, pp. 163-164.
G. Blasse, B.C. Grabmeier, "Luminescent Materials", Springer, 1994, p. 25.
S. Shionoya, W.M. Yen, "Phospher Handbook" CRC press, 1999, ch. 3.3, pp. 183-184.
Garcia Solé, L.E. Bausá, D. Jaque, "An Introduction to the Optical Spectroscopy of Inorganic Solids", Wiley, 2005, pp. 132-133.
S. Shionoya, W.M. Yen, "Phosphor Handbook" CRC press, 1999, ch. 3.3, pp. 179-182.
Notice of Allowance of U.S. Appl. No. 12/440,001 dated on Nov. 7, 2011.
G. Blasse, A. Bril, "Characteristic Luminescence", Philips Technical Review, 31 (1970) 304, p. 306.
G. Blasse, B.C. Grabmeier, "Luminescent Materials", Springer, 1994, pp. 40-47.
R. Chen "Developments in Luminescence and Display Materials Over the Last 100 Years as Reflected in Electrochemical Society Publications", pp. 69-78, 2002.
Non-Final Office Action of U.S. Appl. No. 11/568,769 issued on Feb. 16, 2011.
Non-Final Office Action of U.S. Appl. No. 13/004,554 issued on Mar. 15, 2011.
Notice of Allowance of U.S. Appl. No. 11/024,722 issued on Mar. 10, 2011.
Final Office Action of U.S. Appl. No. 12/196,923 issued on Mar. 4, 2011.
Notice of Allowance of U.S. Appl. No. 11/948,845 issued on Mar. 23, 2011.
Non-Final Office Action of U.S. Appl. No. 12/098,263 issued on Mar. 30, 2011.
Indian Office Action of Indian Application No. 2468/KOLNP/2007 issued on Jan. 28, 2011, corresponding to U.S. Appl. No. 12/098,263.
Non-Final Office Action of U.S. Appl. No. 12/854,001 issued on Apr. 6, 2011.
Non-Final Office Action of U.S. Appl. No. 12/440,001 issued on Apr. 27, 2011.
Chinese Office Action of Chinese Patent Application No. 200880105091.8 issued on Apr. 1, 2011.
Chinese Office Action of Chinese Patent Application No. 201010198537.5 issued on Mar. 18, 2011.
Chinese Office Action of Chinese Patent Application No. 201010185274.4 issued on Mar. 2, 2011.
Austrian Office Action for AT Application No. 9514/2005 issued on Jun. 1, 2011.
Austrian Office Action for AT Application No. 1545/2010-1 issued on May 31, 2011.
Final Office Action of U.S. Appl. No. 12/731,811 issued on Jul. 29, 2011.
Notice of Allowance of U.S. Appl. No. 11/948,813 issued on Aug. 22, 2011.
Final Office Action of U.S. Appl. No. 12/854,001 issued on Oct. 11, 2011.
Notice of Allowance of U.S. Appl. No. 12/098,263 issued on Oct. 11, 2011.
Non-Final Office Action of U.S. Appl. No. 12/491,780 dated on Dec. 7, 2011.
Notice of Allowance of U.S. Appl. No. 12/196,923 issued on Nov. 10, 2011.
Notice of Allowance of U.S. Appl. No. 13/004,554 mailed on Dec. 13, 2011.
Final Office Action of U.S. Appl. No. 13/099,879 issued on Jan, 11, 2012.
Non-Final Office Action of U.S. Appl. No. 12/295,438 dated on Jan. 12, 2012.
Mark H. Garrett "Properties of photorefractive nonstoichiometric bismuth silicon oxide, BixSio1.5x+2" Center for Material Science and Engineering, Crystal Physics Lab., Massachusetts Institute of Technology, Cambridge, Massachusetts vol. 8, No. 1 Jan. 1991. p. 78-87.
Mesquita, et al. "Preparation and Cathodoluminescence of Ce 3+-activated Yttrium Silicates and some Isostructural Compounds " No1.4, No. 9 p. 643-650 1969 Pergamon Press, Inc in US.
EP Search Report of EP 11 18 4708 dated Nov. 11, 2011.
Declaration under CFR 1.132 of U.S. Appl. No. 11/024,722 dated Aug. 24, 2007.
Tomas L. Barry "Equilibria and Eu2+ luminescence of subsolidus phases bounded by Ba3MgSi2O8, Sr3MgSi2O8 and Ca3MgSi2O8" pp. 733-738 vol. 115, No. 7 J. Electrochem Soc.: Solid State Sceince Jul. 1968.
EP Search Report for EP 05 74 0758 issued on Jul. 26, 2011 correspond to U.S. Appl. No. 11/568,769.
EP Search Report for EP 05 74 0759 issued on Jul. 26, 2011 correspond to U.S. Appl. No. 11/569,060.
Non-Final Office Action dated Apr. 24, 2012 issued for U.S. Appl. No. 12/854,001.
Final Office Action dated Apr. 26, 2012 issued for U.S. Appl. No. 12/491,780.

(56) References Cited

OTHER PUBLICATIONS

Final Office Action dated Apr. 18, 2012 issued for U.S. Appl. No. 12/491,457.
Notice of Allowance dated Apr. 11, 2012 issued for U.S. Appl. No. 12/093,441.
Preliminary Notice of First Office Action with Search Report issued on May 15, 2013 in Taiwanese Patent Application No. 095147024.
Notice of Allowance issued on May 9, 2014 in U.S. Appl. No. 12/097,741.
Non-Final Office Action issued on Jun. 18, 2014 in U.S. Appl. No. 12/295,438.

* cited by examiner

LIGHT EMITTING DEVICE AND LIGHTING SYSTEM HAVING THE SAME

CROSS REFERENCE RELATED APPLICATIONS

This application is a divisional application of U.S. patent application Ser. No. 12/295,438, filed on Sep. 30, 2008, which is the National Stage of International Application No. PCT/KR2007/001587, filed on Mar. 31, 2007, and claims priority from and the benefit of Korean Patent Application No. 10-2006-0029517, filed on Mar. 31, 2006, which are all hereby incorporated by reference for all purposes as if fully set forth herein.

BACKGROUND OF THE INVENTION

1. Field of the Invention

The present invention relates to a light emitting diode, and more particularly, a light emitting diode that can realize different light spectrums and color temperatures by forming a plurality of light emitting portions within a single package.

2. Discussion of the Background

A light emitting diode is an electroluminescence device having a structure in which an n-type semiconductor of which major carriers are electrons and a p-type semiconductor of which major carriers are holes are joined together, and emits predetermined light through recombination of these electrons and holes. A light emitting diode consumes less electric power and has a longer service life as compared with conventional light bulbs or fluorescent lamps. The electric power consumption of a light emitting diode is less than a few tenth to a few hundredth of those of conventional illumination devices, and the life span thereof is several to several ten times, thereby having reduced electric power consumption and excellent durability. Further light emitting diode can be installed in a small space and durable against vibration. A light emitting device using such a light emitting diode is used for display and back light, and a study is actively in progress so as to apply to illumination. A white light emitting diode as well as a light emitting diode with a single color such as red, blue and green is recently released. It is expected that a demand will increase rapidly as light emitting devices using a white light emitting diode are applied to products for a car and illumination.

The organism of humans has the circadian rhythm that means the physiological rhythm repeats in a 24 hours cycle. For example, the human hormone cortisol known as stress hormone as well as melatonin known as sleep hormone have a big influence of alertness and sleep. In the morning the cortisol level is increasing as a basis for the day's activities. The minimum of cortisol is at midnight. In comparison the melatonin level drops in the morning. So sleepiness is reduced. But when the day is ending and it becomes dark the melatonin level is increasing and the sleeping hormone is effective and the basis for a healthy sleep.

In general, light influences the physiological rhythm of humans, and more particularly, the sunlight plays an extremely important role in such an influence. The color temperature of the sunlight is higher than 6000K in the morning and getting decreased during the afternoon gradually. The color temperature indicates a physical figure with Kelvin (K) for a color of a light source. The higher the color temperature is, the more the part of blue is, and the lower the color temperature is, the more the part of yellow-red is dominating. Further, the increasing color temperature makes activity and concentration of the brain increased and the decreasing color temperature makes the sensitivity active and the mind comfortable.

Light provides various feelings according to wavelength or color temperatures and has a great influence on the physiological rhythm of humans. If the physiological rhythm does not adapt properly, many diseases such as digestive trouble and chronic fatigue can be caused. Accordingly, a study on illumination devices with consideration of the circadian rhythm is in progress.

In case of a light emitting device using a conventional light emitting diode, a variety of methods of making white light have been proposed. A common method of making white light is to combine a part of the first light emitted from a light emitting diode chip and the second light which of wavelength is changed by phosphor by applying phosphor around a light emitting diode chip. Phosphor substances for making white light can be garnet phosphors, thiogallate phosphors, sulfide phosphors, silicate phosphors, oxynitride phosphors and so forth. However, a light emitting device using such materials has a disadvantage in that a scope of color temperature is narrow, the color rendering index is very low, and the stability of these lamps is unsatisfactory. That is, there is a problem that it is difficult to manufacture a light emitting device providing various light spectrums or color temperatures.

SUMMARY OF THE INVENTION

The object of the present invention is to provide a light emitting device and lighting system having the same capable of realizing various light spectrums or color temperatures by forming a plurality of light emitting portions within a single package. Another object of the present invention is to provide a light emitting device and lighting system having the same capable of adjusting light spectrums or color temperatures of light according to the physiological rhythm of humans.

According to an exemplary embodiment, a light emitting device includes a first light emitting portion for emitting daylight with a high color temperature of 6000K or more; and a second light emitting portion for emitting warm white light at a color temperature of 3000K or less, wherein each of the first and second light emitting portions comprises a light emitting diode chip and a phosphor, and the first and second light emitting portions are driven independently.

The phosphor is expressed by Chemical Formula 1 as follows:

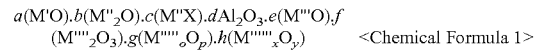
<Chemical Formula 1> wherein the metal M' is one or more elements from the group of Pb, Cu wherein the metal M" is one or more monovalent elements from the group Li, Na, K, Rb, Cs, Au, Ag, $M^{III}$ includes at least one selected from a group consisting of Be, Mg, Ca, Sr, Ba, Zn, Cd and Mn, the $M^{IV}$ includes at least one selected from a group consisting of Sc, B, Ga and In, the $M^{V}$ includes at least one selected from a group consisting of Si, Ge, Ti, Zr, Mn, V, Nb, Ta, W and Mo, the $M^{VI}$ includes at least one selected from a group consisting of Bi, Sn, Sb, Sc, Y, La, Ce, Pr, Nd, Pm, Sm, Eu, Gd, Tb, Dy, Ho, Er, Tm, Yb and Lu, the X includes at least one selected from a group consisting of F, Cl, Br and I, $0<a\leq2$, $0\leq b\leq2$, $0\leq c\leq2$, $0\leq d\leq8$, $0\leq e\leq4$, $0\leq f\leq3$, $0\leq g\leq8$, $1\leq o\leq2$, $1\leq p\leq5$, $0\leq h\leq2$, $1\leq x\leq2$ and $1\leq y\leq5$.

The phosphor is expressed by Chemical Formula 2 as follows:

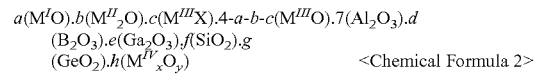
<Chemical Formula 2> wherein the $M^I$ includes at least one selected from a group consisting of Pb and Cu, the $M^{II}$ includes at least one selected from a group consisting of Li, Na, K, Rb, Cs, Au and Ag, the $M^{III}$ includes at least one selected from a group consisting of Be, Mg, Ca, Sr, Ba, Zn, Cd, Mn, the $M^{IV}$ includes at least one selected from a group consisting of Bi, Sn, Sb, Sc, Y, La, In, Ce, Pr, Nd, Pm, Sm, Eu, Gd, Tb, Dy, Ho, Er, Tm, Yb and Lu, the X includes at least one selected from a group of F, Cl, Br and I, $0<a\le4$, $0\le b\le2$, $0\le c\le2$, $a+b+c\le4$, $0\le d\le1$, $0\le e\le1$, $0\le f\le1$, $0\le g\le1$, $0<h\le0.5$, $1\le x\le2$ and $1\le y\le5$.

The phosphor is expressed by Chemical Formula 3 as follows:

$$a(M^IO).b(M^{II}O).c(Al_2O_3).d(M^{III}_2O_3).e(M^{IV}O_2).f(M^V_xO_y) \quad \text{<Chemical Formula 3>}$$

wherein the $M^I$ includes at least one selected from a group consisting of Pb and Cu, the $M^{II}$ includes at least one selected from a group consisting of Be, Mg, Ca, Sr, Ba, Zn, Cd and Mn, the $M^{III}$ includes at least one selected from a group consisting of B, Ga and In, the $M^{IV}$ includes at least one selected from a group consisting of Si, Ge, Ti, Zr and Hf, the $M^V$ includes at least one selected from a group consisting of Bi, Sn, Sb, Sc, Y, La, Ce, Pr, Nd, Pm, Sm, Eu, Gd, Tb, Dy, Ho, Er, Tm, Yb and Lu, $0<a\le1$, $0\le b\le2$, $0<c\le8$, $0\le d\le1$, $0\le e\le1$, $0<f\le2$, $1\le x\le2$ and $1\le y\le5$.

The phosphor is expressed by Chemical Formula 4 as follows:

$$a(M^IO).b(M^{II}O).c(M^{III}X).d(M^{III}_2O).e(M^{IV}_2O_3).f(M^V_oO_p).g(SiO_2).h(M^{VI}_xO_y) \quad \text{<Chemical Formula 4>}$$

wherein the $M^I$ includes at least one selected from a group consisting of Pb and Cu, the $M^{II}$ includes at least one selected from a group consisting of Be, Mg, Ca, Sr, Ba, Zn, Cd and Mn, the $M^{III}$ includes at least one selected from a group consisting of Li, Na, K, Rb, Cs, Au and Ag, the $M^{IV}$ includes at least one selected from a group consisting of Al, Ga, In and B, the $M^V$ includes at least one selected from a group consisting of Ge, V, Nb, Ta, W, Mo, Ti, Zr, Hf and P, $M^{VI}$ includes at least one selected from a group consisting of Bi, Sn, Sb, Sc, Y, La, Ce, Pr, Nd, Pm, Sm, Eu, Gd, Tb, Dy, Ho, Er, Tm, Yb and Lu, the X includes at least one selected from a group consisting of F, Cl, Br and I, $0<a\le2$, $0<b\le8$, $0\le c\le4$, $0\le d\le2$, $0\le e\le2$, $0\le f\le2$, $0\le g\le10$, $0<h\le5$, $1\le o\le2$, $1\le p\le5$, $1\le x\le2$ and $1\le y\le5$.

The phosphor is expressed by Chemical Formula 5 as follows:

$$a(M^IO).b(M^{II}_2O).c(M^{II}X).d(Sb_2O_5).e(M^{III}O).f(M^{IV}_xO_y) \quad \text{<Chemical Formula 5>}$$

wherein the $M^I$ includes at least one selected from a group consisting of Pb and Cu, the $M^{II}$ includes at least one selected from a group consisting of Li, Na, K, Rb, Cs, Au and Ag, the $M^{III}$ includes at least one selected from a group consisting of Be, Mg, Ca, Sr, Ba, Zn, Cd and Mn, the $M^{IV}$ includes at least one selected from a group consisting of Bi, Sn, Sc, Y, La, Pr, Sm, Eu, Tb, Dy and Gd, the X includes at least one selected from a group consisting of F, Cl, Br and I, $0<a\le2$, $0\le b\le2$, $0\le c\le4$, $0<d\le8$, $0\le e\le8$, $0\le f\le2$, $1\le x\le2$ and $1\le y\le5$.

The phosphor is expressed by Chemical Formula 6 as follows:

$$a(M^IO).b(M^{II}_2O).c(M^{II}X).dGeO_2.e(M^{III}O).f(M^{IV}_2O_3).g(M^V_oO_p).h(M^{VI}_xO_y) \quad \text{<Chemical Formula 6>}$$

wherein the $M^I$ includes at least one selected from a group consisting of Pb and Cu, the $M^{II}$ includes at least one selected from a group consisting of Li, Na, K, Rb, Cs, Au and Ag, the $M^{III}$ includes at least one selected from a group consisting of Be, Mg, Ca, Sr, Ba, Zn and Cd, the $M^{IV}$ includes at least one selected from a group consisting of Sc, Y, B, Al, Ga, In and La, the $M^V$ includes at least one selected from a group consisting of Si, Ti, Zr, Mn, V, Nb, Ta, W and Mo, the $M^{VI}$ includes at least one selected from a group consisting of Bi, Sn, Pr, Sm, Eu, Gd and Dy, the X includes at least one selected from a group consisting of F, Cl, Br and I, $0<a\le2$, $0\le b\le2$, $0\le c\le10$, $0<d\le10$, $0\le e\le14$, $0\le f\le14$, $0\le g\le10$, $0\le h\le2$, $1\le o\le2$, $1\le p\le5$, $1\le x\le2$ and $1\le y\le5$.

The phosphor is expressed by Chemical Formula 7 as follows:

$$a(M^IO).b(M^{II}_2O).c(M^{II}X).dP_2O_5.e(M^{III}O).f(M^{IV}_2O_3).g(M^VO_2).h(M^{VI}_xO_y) \quad \text{<Chemical Formula 7>}$$

wherein the $M^I$ includes at least one selected from a group consisting of Pb and Cu, the $M^{II}$ includes at least one selected from a group consisting of Li, Na, K, Rb, Cs, Au and Ag, the $M^{III}$ includes at least one selected from a group consisting of Be, Mg, Ca, Sr, Ba, Zn, Cd and Mn, the $M^{IV}$ includes at least one selected from a group consisting of Sc, Y, B, Al, La, Ga and In, the $M^V$ includes at least one selected from a group consisting of Si, Ge, Ti, Zr, Hf, V, Nb, Ta, W and Mo, $M^{VI}$ includes at least one selected from a group consisting of Bi, Sn, Pr, Sm, Eu, Gd, Dy, Ce and Tb, the X includes at least one selected from a group consisting of F, Cl, Br and I, $0<a\le2$, $0\le b\le12$, $0\le c\le16$, $0<d\le3$, $0\le e\le5$, $0\le f\le3$, $0\le g\le2$, $0<h\le2$, $1\le x\le2$ and $1\le y\le5$.

The light emitting device comprises one or a plurality of phosphor.

The light emitting diode chip emits blue or UV light.

The light emitting device further comprises a controller for controlling voltage applied to at least any one of the first light emitting portion and the second light emitting portion.

The controller controls the voltage input from the outside with respect to time and applies the voltage to at least any one of the first light emitting portion and the second light emitting portion.

The controller increases and decreases voltage with a 24 hour cycle and applies the voltage to at least any one of the first light emitting portion and the second light emitting portion.

The first and second light emitting portions are formed in one package.

The light emitting device further comprises a substrate, wherein the light emitting diode chips of the first and second light emitting portions are mounted on the substrate, and the phosphor of the first and second light emitting portions are disposed on the light emitting diode chips.

The light emitting device further comprises a heat sink for emitting heat generated from the light emitting diode chips, wherein the light emitting diode chips of the first and second light emitting portions are mounted on the heat sink and the phosphor of the first and second light emitting portions are disposed on the light emitting diode chips.

A groove is formed in the substrate, and the first light emitting portion and the second light emitting are formed on the lower of the groove.

The groove comprises a plurality of grooves, each groove is positioned apart from each other, and the first light emitting portion or the second light emitting is formed on the lower of the each groove.

The light emitting device further comprises a molding portion encapsulating the first light emitting portion and the second light emitting in common.

According to an exemplary embodiment, a light emitting device comprises a first light emitting portion for emitting a first white light with a relatively high color temperature; and a second light emitting portion for emitting a second white light with a relatively low color temperature, wherein the first and second light emitting portions are driven independently.

According to an exemplary embodiment, a lighting system comprises a base plate; and a plurality of light emitting device disposed on the base plate, wherein each light emitting device comprises a first light emitting portion for emitting daylight with a high color temperature of 6000K or more, and a second light emitting portion for emitting warm white light at a color temperature of 3000K or less, wherein each of the first light emitting portion and the second light emitting portion comprises a light emitting diode chip and a phosphor, and the first light emitting portion and the second light emitting portion are driven independently.

According to an exemplary embodiment, a lighting system comprises a base plate; and at least one or more first light emitting device and at least one or more second emitting device disposed on the base plate, wherein the first light emitting device comprises a first emitting portion for emitting daylight with a high color temperature of 6000K or more, and the second emitting device comprises a second light emitting portion for emitting warm white light at a color temperature of 3000K or less, wherein each of the first light emitting portion and the second light emitting portion comprises a light emitting diode chip and a phosphor, and the first light emitting portion and the second light emitting portion are driven independently.

The first light emitting device and the second light emitting device are disposed nearly and repeatedly.

The first light emitting device is disposed on a first region of the base plate, and the second light emitting device is disposed on a second region of the base plate.

The present invention has an advantage in that a light emitting device can be diversely applied in a desired atmosphere and use by realizing white light with different light spectrums and color temperatures, as a plurality of light emitting portions are formed in a single package. Particularly, the present invention has the effect on health by appropriately adjusting wavelength or a color temperature of light according to the circadian rhythm of humans. Moreover, there is an effect of reducing cumbersome in procedure and the cost and increasing effective use of space, since it is formed by a single package, which has been comprised of a separated package to realize white light with various spectrum and color temperatures in prior art.

DETAILED DESCRIPTION OF THE ILLUSTRATED EMBODIMENTS

Figure 1:
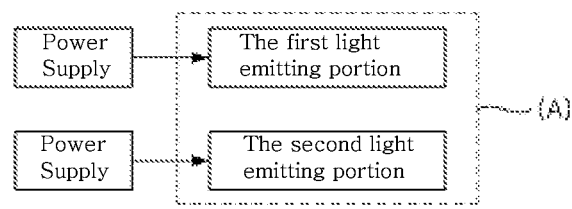
FIG. 1 is a conceptual block diagram illustrating a light emitting device according to a first embodiment of the present invention.

Hereinafter, preferred embodiments of the present invention will be described in detail with reference to the accompanying drawings. These embodiments are provided only for illustrative purposes and for full understanding of the scope of the present invention by those skilled in the art. Accordingly, the present invention is not limited to the embodiments but may be implemented into different forms. In the drawings, the width, length, thickness and the like of each component may be exaggerated for convenience and clarity of illustration. Throughout the drawings, like components are designated by like reference numerals.

A light emitting device according to the present invention is characterized by a first light emitting portion that emits white light with a relatively high color temperature within a single package, a second light emitting portion that emits light with a relatively low color temperature, and possibility of operating independently from the first light emitting portion and the second light emitting portion.

The first light emitting portion emits white light at a color temperature of 6000K or more, which is known as daylight. The second light emitting portion emits white light at a color temperature of 3000K or less, which is known as warm white.

The first and second light emitting portions include a light emitting diode chip and phosphor. The white light with a desired light spectrum and color temperature can be realized by combination of blue light or UV light emitted from a light emitting diode chip and wavelength-converted light by phosphor.

A light emitting diode chip and phosphor forming the first light emitting portion or the second light emitting portion can be diversely comprised. For example, the first light emitting portion or the second light emitting portion can include a single blue light emitting diode chip and a phosphor with yellow emission. The white light is realized by combination of blue light emitted from a light emitting diode chip and wavelength-converted yellow light by phosphor. Further, the first light emitting portion or the second light emitting portion can include a single blue light emitting diode chip, a phosphor with green emission and a phosphor with orange emission. The white light is realized by combination of blue light emitted from a light emitting diode chip and wavelength-converted green and orange light by phosphors. In this case, there is an advantage in that the color rendering index is more improved than that of the white light realized by combination of blue light emitted from a light emitting diode chip and wavelength-converted yellow light by phosphor. Namely, the color rendering index can be improved by using a light emitting diode chip and a plurality of phosphor materials with different emission peaks.

It is preferable to use a blue light emitting diode chip or a UV light emitting diode chip as the aforementioned light emitting diode chips.

The aforementioned phosphors are characterized by using phosphor materials with different emission peaks, for example silicate phosphor with emission peaks from green to red. The white light with various light spectrums and color temperatures can be realized by making a variety of colors out of light emitted from a light emitting diode chip. In case of using a plurality of phosphor materials, an influence of phosphor materials on each other can be minimized by using the same series of phosphor materials.

The aforementioned phosphor materials include aluminates, silicates, oxynitrides, antimonates, germanates, or phosphates. Particularly, use of phosphor materials containing Pb or Cu causes the high stability and excellent photoexcitation.

The aluminate phosphors include phosphor materials expressed by the following chemical formula 1, 2 and 3.

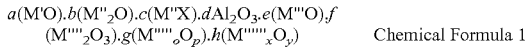  Chemical Formula 1 wherein the metal M' is one or more elements from the group of Pb, Cu wherein the metal M" is one or more monovalent elements from the group Li, Na, K, Rb, Cs, Au, Ag, wherein $M^{III}$ is one or more divalent elements from the group of Be, Mg, Ca, Sr, Ba, Zn, Cd, Mn, wherein the metal $M^{IV}$ is one or more trivalent elements from the group of Sc, B, Ga, In, wherein the metal $M^{V}$ is one or more elements from the group of Si, Ge, Ti, Zr, Mn, V, Nb, Ta, W, Mo, wherein the metal $M^{VI}$ is at least one or more elements from the group of Bi, Sn, Sb, Sc, Y, La, Ce, Pr, Nd, Pm, Sm, Eu, Gd, Tb, Dy, Ho, Er, Tm, Yb, Lu wherein X is one or more elements from the group of F, Cl, Br, I, and wherein a range of a, b, c, d, e, f, g, o, p, h, x and y is $0<a\leq2$, $0\leq b\leq2$, $0\leq c\leq2$, $0\leq d\leq8$, $0\leq e\leq4$, $0\leq f\leq3$, $0\leq g\leq8$, $1\leq o\leq2$, $1\leq p\leq5$, $0\leq h\leq2$, $1\leq x\leq2$ and $1\leq y\leq5$ respectively.

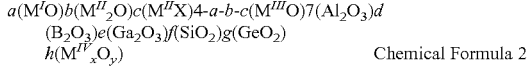  Chemical Formula 2 wherein $M^{I}$ is one or more elements from the group of Pb, Cu, wherein $M^{II}$ is one or more monovalent element from Li, Na, K, Rb, Cs, Au, Ag, wherein $M^{III}$ is one or more divalent elements from the group of Be, Mg, Ca, Sr, Ba, Zn, Cd, Mn, wherein $M^{IV}$ is one or more elements from the group of Bi, Sn, Sb, Sc, Y, La, In, Ce, Pr, Nd, Pm, Sm, Eu, Gd, Tb, Dy, Ho, Er, Tm, Yb, Lu, wherein X is one or more elements from the group F, Cl, Br, I, and wherein a range of a, b, c, d, e, f, g, h, x and y is $0<a\leq4$, $0\leq b\leq2$, $0\leq c\leq2$, $a+b+c<4$, $0\leq d\leq1$, $0\leq e\leq1$, $0\leq f\leq1$, $0\leq g\leq1$, $0<h\leq0.5$, $1\leq x\leq2$ and $1\leq y\leq5$ respectively.

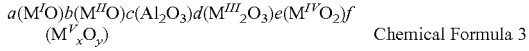  Chemical Formula 3 wherein $M^{I}$ is at least one or more elements from the group of Pb, Cu, wherein $M^{II}$ is at least one or more divalent elements from the group of Be, Mg, Ca, Sr, Ba, Zn, Cd, Mn, wherein $M^{III}$ is one or more elements from the group of B, Ga, In, wherein $M^{IV}$ is one or more elements from the group of Si, Ge, Ti, Zr, Hf, wherein $M^{V}$ is at least one or more elements from the group of Bi, Sn, Sb, Sc, Y, La, Ce, Pr, Nd, Pm, Sm, Eu, Gd, Tb, Dy, Ho, Er, Tm, Yb, Lu, and wherein a range of a, b, c, d, e, f, x and y is $0<a\leq1$, $0\leq b\leq2$, $0<c\leq8$, $0\leq d\leq1$, $0\leq e\leq1$, $0<f\leq2$, $1\leq x\leq2$ and $1\leq y\leq5$ respectively.

The silicate phosphors include phosphor materials expressed by the following chemical formula 4.

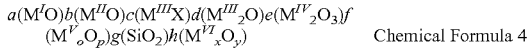  Chemical Formula 4 wherein $M^{I}$ is one or more elements from the group of Pb, Cu, wherein $M^{II}$ is one or more divalent elements from the group of Be, Mg, Ca, Sr, Ba, Zn, Cd, Mn, wherein $M^{III}$ is one or more monovalent elements from the group Li, Na, K, Rb, Cs, Au, Ag, wherein $M^{IV}$ is one or more from the group Al, Ga, In, B, wherein $M^{V}$ is one or more elements from the group Ge, V, Nb, Ta, W, Mo, Ti, Zr, Hf, P, wherein $M^{VI}$ is at least one or more elements from the group of Bi, Sn, Sb, Sc, Y, La, Ce, Pr, Nd, Pm, Sm, Eu, Gd, Tb, Dy, Ho, Er, Tm, Yb, Lu, wherein X is at least one or more elements from the group F, Cl, Br, I and wherein a range of a, b, c, d, e, f, g, h, o, p, x and y is $0<a\leq2$, $0<b\leq8$, $0\leq c\leq4$, $0\leq d\leq2$, $0\leq e\leq2$, $0\leq f\leq2$, $0\leq g\leq10$, $0<h\leq5$, $1\leq o\leq2$, $1\leq p\leq5$, $1\leq x\leq2$ and $1\leq y\leq5$ respectively.

The antimonate phosphors include phosphor materials expressed by the following chemical formula 5.

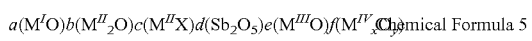  Chemical Formula 5 wherein $M^{I}$ is one or more elements from the group of Pb, Cu, wherein $M^{II}$ is one or more monovalent elements from the group Li, Na, K, Rb, Cs, Au, Ag, wherein the metal $M^{III}$ is one or more divalent elements from the group of Be, Mg, Ca, Sr, Ba, Zn, Cd, Mn, wherein the metal $M^{IV}$ is at least one or more elements from the group of Bi, Sn, Sc, Y, La, Pr, Sm, Eu, Tb, Dy, Gd, wherein X is at least one or more elements from the group F, Cl, Br, I, and wherein a range of a, b, c, d, e, f, x and y is $0<a\leq2$, $0\leq b\leq2$, $0\leq c\leq4$, $0<d\leq8$, $0\leq e\leq8$, $0\leq f\leq2$, $1\leq x\leq2$ and $1\leq y\leq5$ respectively.

The germanate phosphors include phosphor materials expressed by the following chemical formula 6.

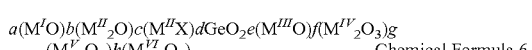  Chemical Formula 6 wherein $M^{I}$ is one or more elements from the group of Pb, Cu wherein $M^{II}$ is one or more monovalent elements from the group Li, Na, K, Rb, Cs, Au, Ag, wherein $M^{III}$ is one or more divalent elements from the group of Be, Mg, Ca, Sr, Ba, Zn, Cd, wherein $M^{IV}$ is one or more trivalent elements from the group of Sc, Y, B, Al, Ga, In, La, wherein $M^{V}$ is one or more element from the group of Si, Ti, Zr, Mn, V, Nb, Ta, W, Mo, wherein $M^{VI}$ is at least one or more elements from the group of Bi, Sn, Pr, Sm, Eu, Gd, Dy, wherein X is at least one or more elements from the group F, Cl, Br, I, and wherein a range of a, b, c, d, e, f, g, h, o, p, x and y is $0<a\leq2$, $0\leq b\leq2$, $0\leq c\leq10$, $0<d\leq10$, $0\leq e\leq14$, $0\leq f\leq14$, $0\leq g\leq10$, $0\leq h\leq2$, $1\leq o\leq2$, $1\leq p\leq5$, $1\leq x\leq2$ and $1\leq y\leq5$ respectively.

The phosphate phosphors include phosphor materials expressed by the following chemical formula 7.

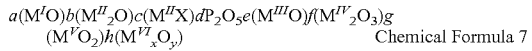  Chemical Formula 7 wherein $M^{I}$ is one or more elements from the group of Pb, Cu, wherein $M^{II}$ is one or more monovalent elements from the group Li, Na, K, Rb, Cs, Au, Ag, wherein $M^{III}$ is one or more divalent elements from the group of Be, Mg, Ca, Sr, Ba, Zn, Cd, Mn, wherein $M^{IV}$ is one or more trivalent elements from the group of Sc, Y, B, Al, La, Ga, In, wherein $M^V$ is one or more element from the group of Si, Ge, Ti, Zr, Hf, V, Nb, Ta, W, Mo, wherein $M^{VI}$ is at least one or more elements from the group of Bi, Sn, Pr, Sm, Eu, Gd, Dy, Ce, Tb, wherein X is at least one or more elements from the group F, Cl, Br, I, and wherein a range of a, b, c, d, e, f, g, h, x and y is $0<a\leq2$, $0\leq b\leq12$, $0\leq c\leq16$, $0<d\leq3$, $0\leq e\leq5$, $0\leq f\leq3$, $0\leq g\leq2$, $0<h\leq2$, $1\leq x\leq2$ and $1\leq y\leq5$ respectively.

FIG. 1 is a conceptual block diagram illustrating a light emitting device according to a first embodiment of the present invention.

Referring to FIG. 1, a light emitting device includes a first light emitting portion that emits white light at a color temperature of 6000K or more, second light emitting portion that emits white light at a color temperature of 3000K less, and the said first light emitting portion and second light emitting portion are characterized by independent driving. In this kind of a light emitting device, since a plurality of light emitting portions in a single package (A) can have its own electrical connection, the said first light emitting portion and second light emitting portion can be driven independently. For example, in case that only first light emitting portion is powered on, white light at a color temperature of 6000K or more (daylight) can be realized, and in case that only second light emitting portion is powered on, white light at a color temperature of 3000K or less (warm white) can be realized. Moreover, in case that the first light emitting portion and second light emitting portion are powered on together, white at with a color temperature range in between 3000K and 6000K can be realized by combination of the white light from the first light emitting portion and the second light emitting portion. Therefore, a light emitting device can realize white light with the high CRI, variable spectrum and color temperature by selective driving of a first light emitting device and a second light emitting device. Since a light emitting device according to the present invention can realize variable spectrum and color temperature of white light, it is advantageous that it can be applied variously in desired atmosphere and uses with only single package (A). For instance, driving a first light emitting portion, which emits white light at a color temperature of 6000K or more (daylight) in the daytime, activity and concentration of human brain can be improved, and driving second light emitting portion, which emits white light at a color temperature of 3000K or less (warm white) in the night time, it helps people to have more peaceful and comfortable rest. Especially, it has effect of improving health by controlling wavelength and color temperature of the light appropriately according to circadian function of effects of human being.

Figure 2:
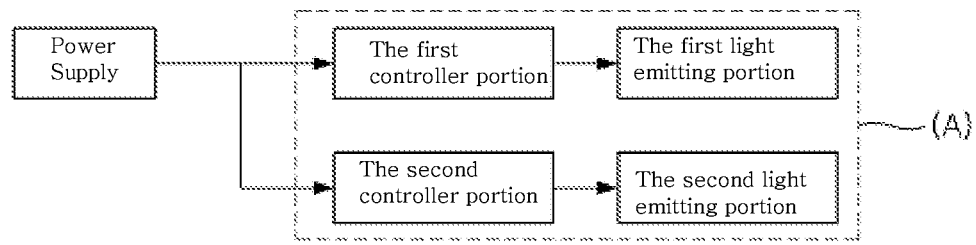
FIG. 2 is a concept block diagram illustrating a light emitting device according another embodiment of the present invention.

FIG. 2 is a concept block diagram illustrating a light emitting device according to another embodiment of the present invention.

Referring to FIG. 2, a light emitting device comprises a first light emitting portion that emits white light at a color temperature of 6000K or more, a second light emitting portion that emits white light at a color temperature of 3000K or less, a first controller part connected to the said first light emitting portion, and a second controller part connected to the said second light emitting portion. And the first and second controller parts are characterized by control of input power from the outside to the first and second light emitting portions.

The said first and second controller part are to control each input voltage to the first and second light emitting portion, for example, the said first and second controller parts control the input voltage from the power by the time and output. So the said first and second controller parts can include timer and voltage controller circuit. That is, input voltage to the controller part from the power outside is controlled through timer and voltage controller circuit by the time then it is passed to the first and second light emitting portions.

Figure 3:
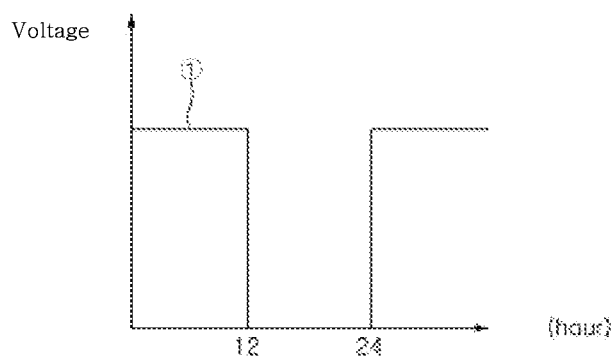
FIGS. 3 and 4 are graphs illustrating an embodiment of first and second controller parts respectively.
Figure 4:
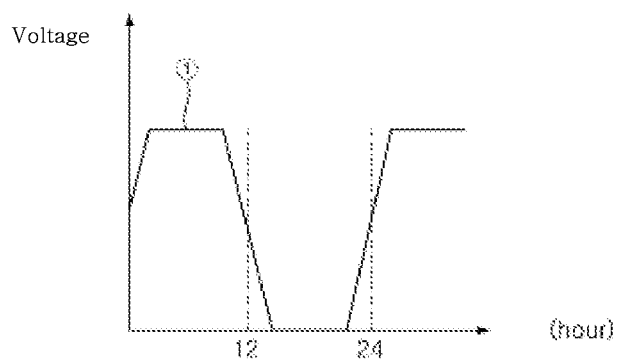

FIGS. 3 and 4 are graphs illustrating an embodiment of the first and second controller parts respectively.

As shown in FIG. 3, the first controller part (①) passes the voltage from the power outside for first 12 hours of the day, and blocks the voltage for remaining 12 hours of the day. In contrast, the second controller part (②) blocks the voltage for first 12 hours of the day as shown in the FIG. 4, and passes the voltage for remaining 12 hours of the day. That is, for 12 hours of a day, power is delivered to only the first light emitting portion for driving, and for remaining 12 hours of a day, power is delivered to only the second light emitting portion for driving.

Operation of light emitting device is explained as follows. Power is impressed to the first and second controller parts, and the first and second controller parts control the voltage by the time and deliver to the first and second light emitting portion. As mentioned above, voltage impressed from power outside is delivered to only the first light emitting portion for 12 hours of a day, and it is delivered to only the second light emitting portion for remaining 12 hours of a day.

That is, for 12 hours of a day, for example, white light at a color temperature of 6000K or more (daylight) can be realized by driving only the first light emitting portion in the daytime, and for remaining 12 hours of a day, for example, white light at a color temperature of 3000K or less (warm white) can be realized by driving only the second light emitting portion.

Figure 5:
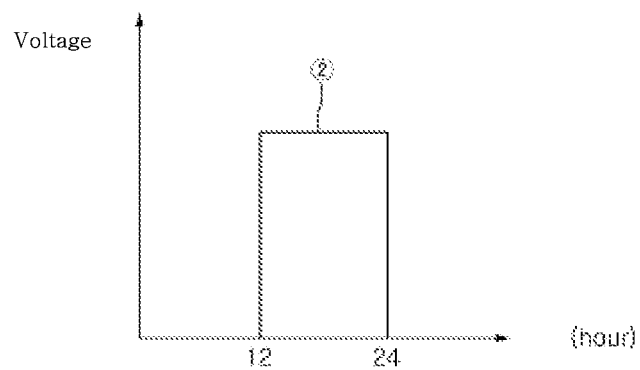
FIGS. 5 and 6 are graphs illustrating another embodiment of first and second controller parts respectively.
Figure 6:
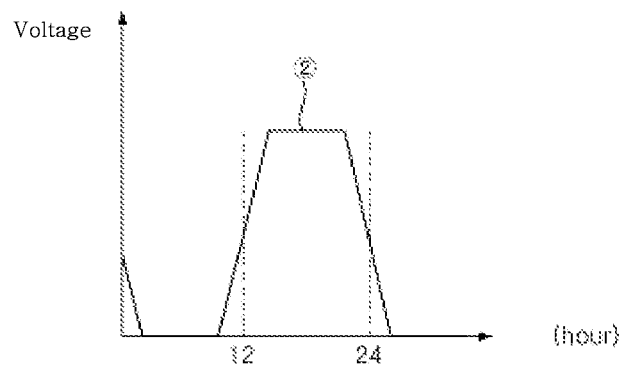

The aforementioned is showing an example of power on/off to the first and second light emitting portions, but it is not limited to, it can be applied in various ways. For instance, as it is shown in FIGS. 5 and 6, luminous intensity of the first and second light emitting portions can be increased or decreased as the voltage is increased or decreased by the time. Accordingly, a color temperature of white light emitted from a light emitting device can be increased or decreased gradually.

Since such a light emitting device can control the operation of the first and second light emitting devices through the first and second controller parts, it can be applied in various ways as desired.

So that, a light emitting device of which color temperature is controlled automatically can be produced without a separated input by the time. For instance, a light emitting device can be formed to realize a relatively high color temperature during the daytime, and a relatively low color temperature during the nighttime. Especially, it has effect of improving health by controlling wavelength and a color temperature of the light appropriately according to the circadian rhythm of humans.

The aforementioned embodiment explained a controller part, which controls voltage by the time, but it is not limited to, the said controller part can include an additional separate input part, so that, it can be formed to adjust a color temperature as user's desire. Moreover, the aforementioned embodiment showed that power is impressed to the first and second controller parts at the same time, but it is not limited to, the said first and second controller parts can be connected to separated power, and they can be driven independently. Furthermore, they can be formed to include only one controller, which can control the first and second light emitting portions together.

Since such a light emitting device can realize various spectrum and color temperature of white light, it is advantageous that it can be applied variously in desired atmosphere and uses with only single package (A). For instance, driving a first light emitting portion, which emits white light at a color temperature of 6000K or more (daylight) in the daytime, activity and concentration of human brain can be improved, and driving second light emitting portion, which emits white light at a color temperature of 3000K or less (warm white) in the night time, it helps people to have more peaceful and comfortable rest. Especially, it has effect of improving health by controlling wavelength and a color temperature of the light appropriately according to the circadian rhythm of humans.

Moreover, there is an effect of reducing cumbersome in procedure and the cost and increasing effective use of space, since it is formed by a single package, which has been comprised of a separated package to realize white light with various spectrum and color temperatures in prior art.

The present invention is described more specifically in the following examples.

Example 1

A first light emitting portion is comprised of a light emitting diode chip with wavelength of 456 nm (blue light), the phosphor consisting of $Cu_{0.15}Ba_{1.82}Sr_{0.03}Si_{0.99}Ge_{0.01}O_4$:Eu with peak emission of 515 nm, and the phosphor consisting of $Cu_{0.05}Sr_{1.72}Ca_{0.23}Si_{0.99}Ge_{0.01}O_4$:Eu with peak emission of 593 nm.

A second light emitting portion is comprised of a light emitting diode chip with wavelength of 452 nm, the phosphor consisting of $Cu_{0.15}Ba_{1.84}Sr_{0.01}Si_{0.99}Zr_{0.01}O_4$:Eu with peak emission of 508 nm, and the phosphor consisting of $Cu_{0.05}Sr_{1.85}Ca_{0.10}SiO_4$:Eu with peak emission of 605 nm.

Figure 7:
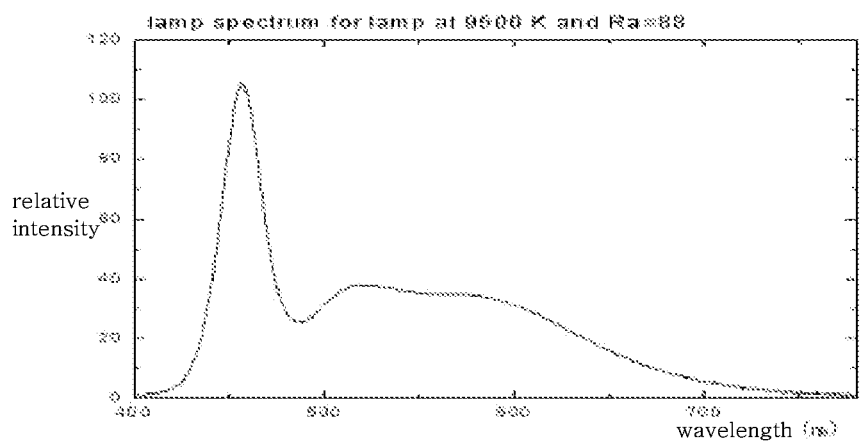
FIGS. 7 and 8 are graphs showing light spectrum of the light emitting device according to a first embodiment.
Figure 8:
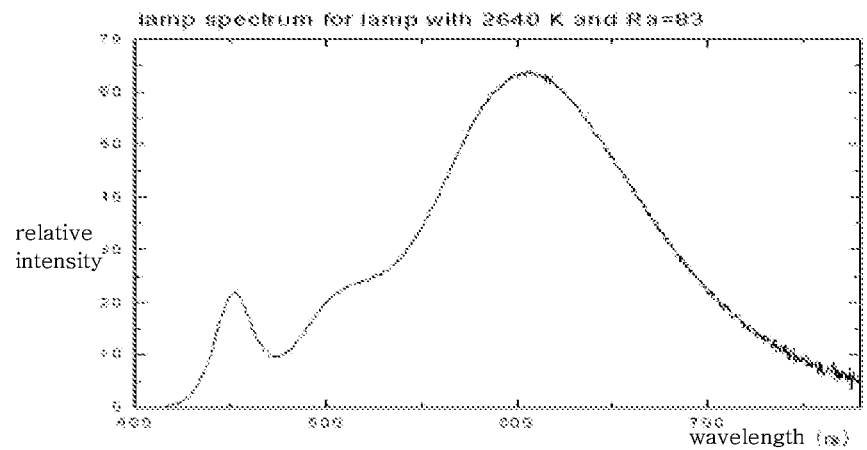

FIG. 7 shows emission spectrum of the first light emitting portion and FIG. 8 shows emission spectrum of the second light emitting portion. As illustrated in the figure, luminous intensity of the first light emitting portion is relatively high in blue emission region, and luminous intensity of the second light emitting portion is relatively high in yellow or red emission region. That is, a color temperature of the first light emitting portion is relatively high and a color temperature of the second light emitting portion is relatively low.

The first light emitting portion of this embodiment has 9,500K of a color temperature with excellent color rendering index of 88. Moreover, the second light emitting portion has 2,640K of a color temperature with excellent color rendering index of 83.

So that, selective driving of first light emitting portion and second light emitting portion, white light with excellent color rendering index and various spectrum can be realized. For example, only driving the first light emitting portion in the daytime, white light with relatively high color temperature, 9,500K is realized, and only driving second light emitting portion in the nighttime, white light with relatively low color temperature, 2,640K is realized.

Example 2

A first light emitting portion is comprised of a light emitting diode chip with wavelength of 456 nm, the phosphor consisting of $Cu_{0.15}Ba_{1.82}Sr_{0.03}Si_{0.99}Ge_{0.01}O_4$:Eu with peak emission of 515 nm, and the phosphor consisting of $Cu_{0.05}Sr_{1.8}Ca_{0.15}SiO_4$:Eu with peak emission of 600 nm.

A second light emitting portion is comprised of a light emitting diode chip with wavelength of 456 nm, the phosphor consisting of $Cu_{0.15}Ba_{1.82}Sr_{0.03}Si_{0.99}Ge_{0.01}O_4$:Eu, with peak emission of 515 nm, and the phosphor consisting of $Cu_{0.05}Sr_{1.8}Ca_{0.15}SiO_4$:Eu with peak emission of 600 nm.

The phosphors mixing ratio of the first emitting portion is different from the phosphors mixing ratio of the second emitting portion, so that color temperature and color rendering index of the first emitting portion are different from them of the second emitting portion.

Figure 9:
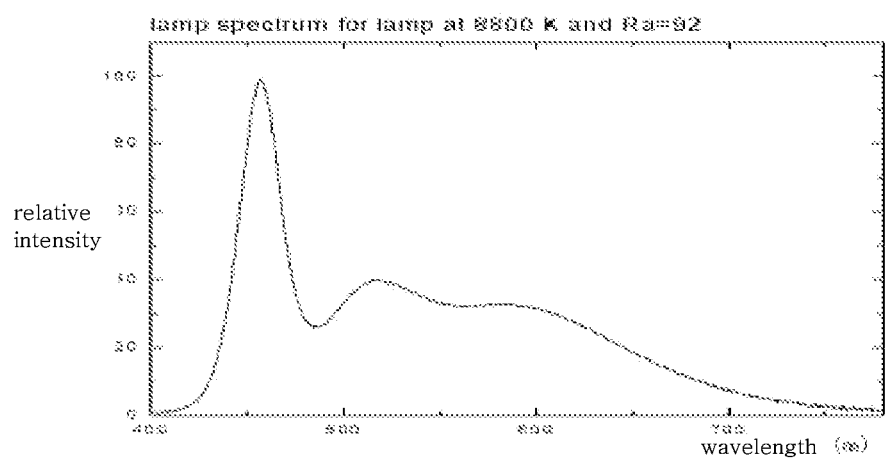
FIGS. 9 and 10 are graphs showing light spectrum of the light emitting device according to a second embodiment.
Figure 10:
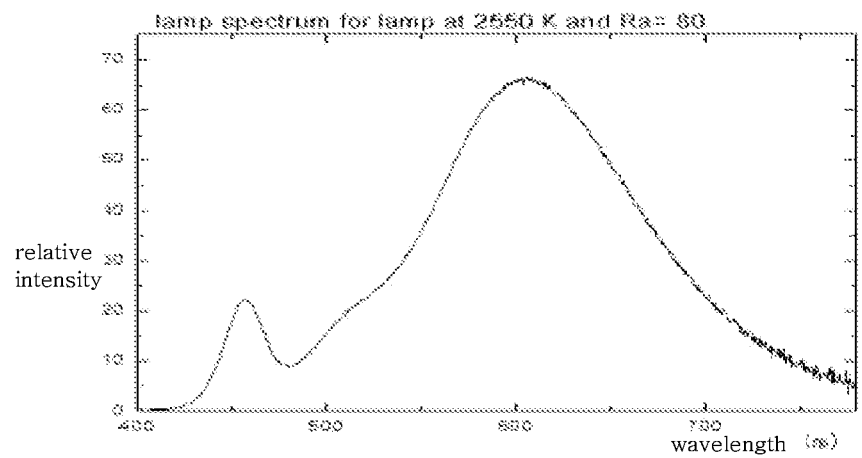

FIG. 9 shows light spectrum of the first light emitting portion and FIG. 10 shows light spectrum of the second light emitting portion. As shown in FIGS. 9 and 10, a color temperature of the first light emitting portion is relatively high and a color temperature of the second light emitting portion is relatively low.

The first light emitting portion of this embodiment has 8,800K of a color temperature with an excellent color rendering index of 92. Moreover, the second light emitting portion has 2,550K of a color temperature with an excellent color rendering index of 80.

The white light with an excellent color rendering index and various light spectrum and color temperatures can be realized by selective driving of first light emitting portion and second light emitting portion. For example, the white light with a color temperature of 8800K which is relatively high is rendered during the day by driving only the first light emitting portion, and the white light with a color temperature of 2550K which is relatively low is rendered during the night by driving only the second light emitting portion.

Example 3

A first light emitting portion is comprised of a light emitting diode chip that emits UV light with wavelength of 405 nm, the phosphor consisting of $Cu_{0.02}Ba_{2.8}Sr_{0.2}Mg_{0.98}Si_2O_8$:Eu with emission peak of 440 nm, the phosphor consisting of $Cu_{0.15}Ba_{1.84}Sr_{0.01}Si_{0.99}Zr_{0.01}O_4$:Eu with emission peak of 508 nm, the phosphor consisting of $Cu_{0.02}Ba_{0.98}Sr_{0.98}Ca_{0.02}SiO_4$:Eu with emission peak of 565 nm, and the phosphor consisting of $Cu_{0.15}Mg_{0.85}BaP_2O_7$:Eu, Mn with emission peak of 630 nm.

A second light emitting portion is comprised of a light emitting diode chip that emits UV light with wavelength of 405 nm, the phosphor consisting of $Cu_{0.02}Ba_{2.8}Sr_{0.2}Mg_{0.98}Si_2O_8$:Eu with emission peak of 440 nm, the phosphor consisting of $Cu_{0.15}Ba_{1.82}Sr_{0.03}Si_{0.99}Ge_{0.01}O_4$:Eu with emission peak of 515 nm, the phosphor consisting of $Cu_{0.05}Sr_{1.72}Ca_{0.23}Si_{0.99}Ge_{0.01}O_4$:Eu with emission peak of 593 nm, and the phosphor consisting of $Cu_{0.15}Mg_{0.85}BaP_2O_7$:Eu, Mn with emission peak of 630 nm.

Figure 11:
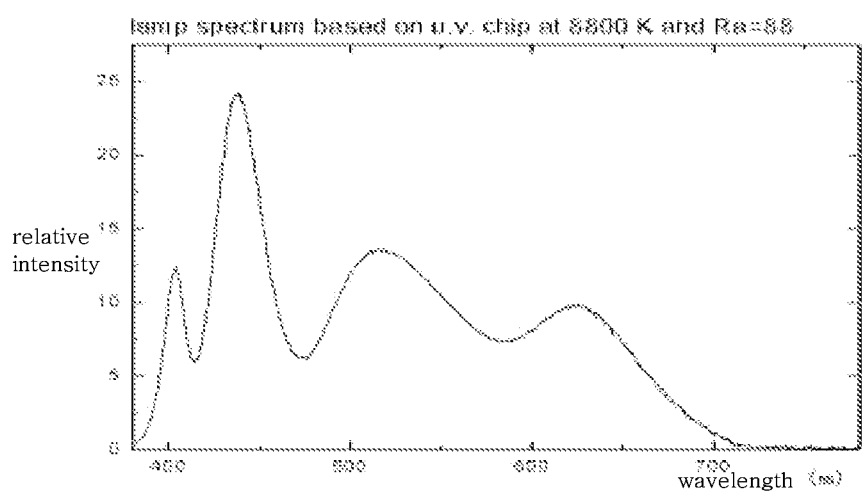
FIGS. 11 and 12 are graphs showing light spectrum of the light emitting device according to a third embodiment.
Figure 12:
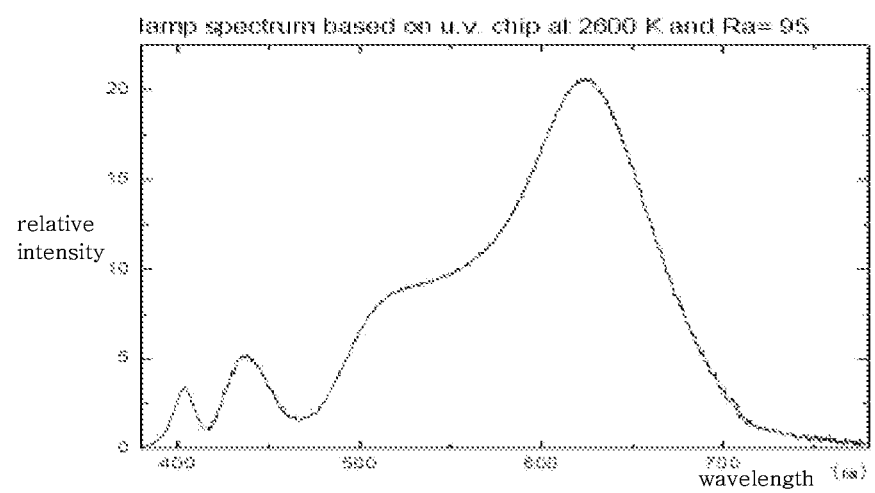

FIG. 11 shows light spectrum of the first light emitting portion and FIG. 12 shows light spectrum of the second light emitting portion. As shown in FIGS. 11 and 12, a color temperature of the first light emitting portion is relatively high and a color temperature of the second light emitting portion is relatively low.

The first light emitting portion of this embodiment has 8,800K of a color temperature with an excellent color rendering index of 88. Moreover, the second light emitting portion has 2600K of a color temperature with an excellent color rendering index of 95.

The white light with an excellent color rendering index and various light spectrum and color temperatures can be realized by selective driving of first light emitting portion and second light emitting portion. For example, the white light with a color temperature of 8800K which is relatively high is rendered during the day by driving only the first light emitting portion, and the white light with a color temperature of 2600K which is relatively low is rendered during the night by driving only the second light emitting portion.

FIGS. 13 to 17 show the light emitting devices applying to different structures according to the present invention.

Figure 13:
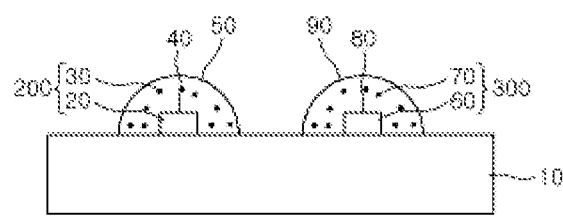
FIGS. 13 to 18 are sectional views of the light emitting devices applying to different structures.

Referring to FIG. 13, a light emitting device comprises a substrate (10), a first light emitting portion (200) and a second light emitting portion (300) mounted on the substrate (10).

The first light emitting portion (200) comprises a first light emitting diode chip (20) and a first phosphor (30). The first phosphor (30) mixed in thermoset resin(50) such as epoxy and silicon is disposed on the first light emitting diode chip (20). The first light emitting portion (200) renders white light at a color temperature of 6000K or more (daylight) by combination of light emitted from the first light emitting diode chip (20) and wavelength-converted light by the first phosphor (30).

Likewise, the second light emitting portion (300) comprises a second light emitting diode chip (60) and a second phosphor (70). The second phosphor (70) mixed in thermoset resin(90) such as epoxy and silicon is disposed on the second light emitting diode chip (60). The second light emitting portion (300) renders white light at a color temperature of 3000K or less (warm white) by combination of light emitted from the second light emitting diode chip (60) and wavelength-converted light by the second phosphor (70).

Figure 14:
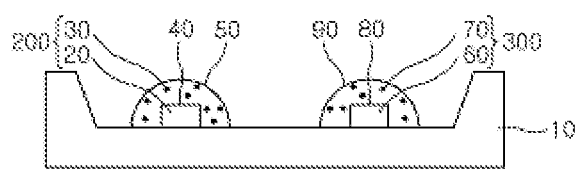

The substrate (10) can have a predetermined slope on the sidewalls of a cavity by forming a predetermined cavity wherein first and second light emitting portion (200, 300) are formed. Referring to FIG. 14, a light emitting device comprises the substrate (10) with the cavity (100), and the first light emitting portion (200) and the second light emitting portion (300) formed on the bottom of the cavity (100). The first light emitting portion (200) comprising the first light emitting diode chip (20) and the first phosphor (30) and the second light emitting portion (300) comprising the second light emitting diode chip (60) and the second phosphor (70) are formed on the bottom of the cavity (100). A compound (50, 90) of the first and second phosphor (30, 70) and thermoset resin is disposed on the first and second light emitting diode chips (20, 60). A predetermined slope of the sidewalls of the cavity (100) can maximize reflection of light emitted from the light emitting diode chips (20, 60) and increase luminescent efficiency. A molding portion (not shown) can be formed by filling the inside of the cavity (100) with transparent thermoset resin in order to protect the first and second light emitting portion (200, 300).

Figure 15:
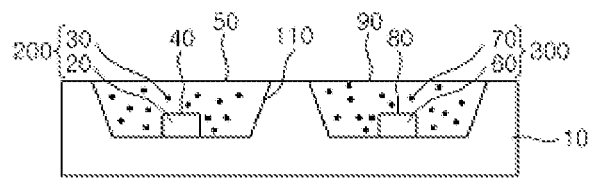

Further, a cavity corresponding to each of light emitting portions can be formed to separate the first light emitting portion (200) from the second light emitting portion (300). Referring to FIG. 15, a light emitting device comprises a substrate (100) with a plurality of cavities to separate light emitting portions (200, 300), and the first light emitting portion (200) and the second light emitting portion (300) separately formed on the bottom of the cavity. The first light emitting portion (200) is formed by mounting the first light emitting diode chip (20) on the bottom of a cavity (110) and filling the inside of the cavity (110) with a compound (50) of the first phosphor (30) and thermoset resin. The second light emitting portion (300) can be formed in the same way. At this time, reflection of light emitted from the light emitting diode chips (20, 60) can be maximized and luminescent efficiency can be increased by forming a predetermined slope of the sidewalls of each of the cavities.

Figure 16:
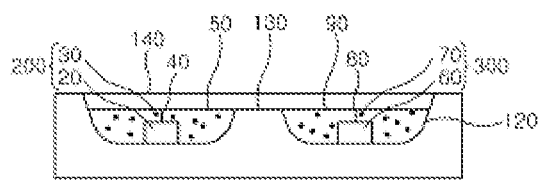

A shape of the sidewalls of the cavity can be curved as well as straight. Referring to FIG. 16, a light emitting device comprises a substrate (10) wherein a cavity (120) is formed with the curved sidewalls, and the first light emitting portion (200) and the second light emitting portion (300) formed on the bottom of the cavity (120). Further, a partition (130) can be formed in a predetermined area of the bottom of the cavity (120) to separate the first light emitting portion (200) from the second light emitting portion (300). The partition (130) can be formed at the same height as the substrate (10) as shown in FIG. 15, or the partition can be formed at a lower height than the substrate (10) to separate the first light emitting portion (200) from the second light emitting portion (300) and a molding portion (140) filling the first and second light emitting portion (200, 300) together can be formed as shown in FIG. 16. In this case, it is advantageous to protect the first and second light emitting portion (200, 300) and make combination of light emitted from the first and second light emitting portion (200, 300) easy.

Figure 17:
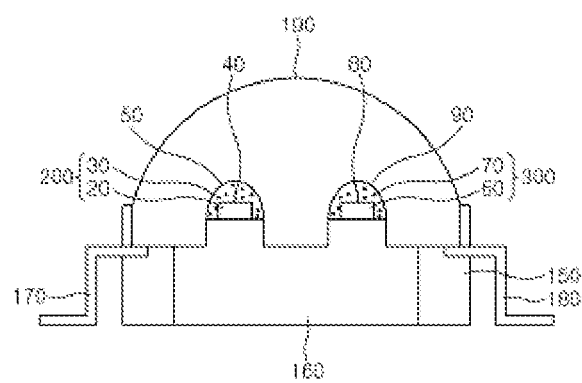

FIG. 17 shows an example of a light emitting device for efficiently emitting heat generated from the light emitting diode chips (20, 60). The light emitting device comprises a heat sink (160), the first light emitting portion (200) and the second light emitting portion (300) formed on the heat sink (160), a housing (150) surrounding the heat sink (160) leas frames (170, 180) protruding toward the outside of the housing, and a molding portion (190) filling the first and second light emitting portion (200, 300). At this time, use of excellent thermal conductive materials such as metal as a heat sink (160) can make it more efficient to emit heat generated from the light emitting diode chips (20, 60).

The heat sink (160) includes a protruding portion corresponding to each of the light emitting portions (200, 300) to make it easy to dispose a compound (50, 90) of the phosphor (30, 70) and thermoset resin on the light emitting diode chips (20, 60), but is not limited to. Further, a light emitting portion may be formed on a plane of the heat sink or on the bottom of the cavity of a heat sink.

In the aforementioned description, the first and second light emitting portions consist of a light emitting diode chip each, but is not limited to. The first and second light emitting portions may consist of a plurality of light emitting diode chips.

As the above, the present invention can be applied to various products as well as illumination. A number of light emitting diodes from 50 to 80 are needed to apply to illumination. Accordingly, packages manufactured with different structures may be mounted on a substrate or a number of light emitting diode chips may be mounted directly on a substrate.

Figure 18:
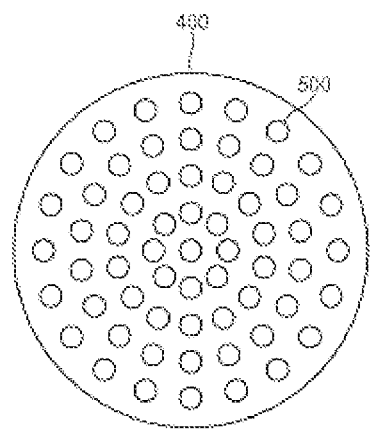

As shown FIG. 18, a number of dots (500) are formed on a substrate (400) and each of dots (500) can comprise the first light emitting portion and the second light emitting portion. That is, each of dots (500) can render daylight and warm white, but is not limited to. Each of dots (500) can include either the first light emitting portion or the second light emitting portion. A dot including the first light emitting portion and a dot including the second light emitting portion may be arranged alternately with each other, or a group of dots including the first light emitting portion and a group of dots second light emitting portion may be arranged separately from each other. Dots can be arranged in various forms according to convenience of process or a desired purpose.

Hereinafter, preferred embodiments of the present invention have been described, but these embodiments are provided only for illustrative purposes and for full understanding of the scope of the present invention by those skilled in the art. Accordingly, the present invention is not limited to the embodiments but may be implemented into different forms.

What is claimed is:

1. A lighting system, comprising:
   a base plate comprising cavities;
   a plurality of light emitting devices disposed in the cavities; and a molding portion,
wherein each of the plurality of light emitting devices consists of a single first light emitting portion and a single second light emitting portion, the single first light emitting portion having a color temperature higher than that of the single second light emitting portion, wherein each of the single first light emitting portion and the single second light emitting portion comprises a light emitting diode chip and a phosphor,
wherein only one light emitting diode chip is included in the first light emitting portion and only one light emitting diode chip is included in the second light emitting portion,
wherein the single first light emitting portion and the single second light emitting portion are driven independently,
wherein the single first light emitting portion and the single second light emitting portion are separated by a sidewall of one of the cavities,
wherein the lighting system further comprises at least one controller configured to drive only the single first light emitting portion for a first period of time and drive only the single second light emitting portion for a second period of time,
wherein the first period of time is followed by the second period of time,
wherein the molding portion encapsulates both the single first light emitting portion and the single second light emitting portion disposed in the cavities and separated by the sidewall of one of the cavities,
wherein the sidewall of one of the cavities forms a uniform surface with the phosphor from the single first light emitting portion and the single second light emitting portion, and
wherein the molding portion is disposed on the uniform surface and the molding portion forms an uppermost surface that is the same height as a top surface of the base plate.

2. The lighting system claimed in claim 1, wherein the at least one controller is configured to drive the single first light emitting portion for the first period of time and drive the single second light emitting portion for the second period of time according to a circadian rhythm of a user.

3. The lighting system claimed in claim 1,
wherein the at least one controller comprises a first controller connected to the single first light emitting portion, and a second controller connected to the single second light emitting portion, and
wherein the first controller and the second controller are configured to control a voltage input to the single first light emitting portion and the single second light emitting portion, respectively.

4. The lighting system claimed in claim 3, wherein the first controller passes the voltage for a first 12 hours of a day, and blocks the voltage for a second 12 hours of the day, and wherein the second controller blocks the voltage for the first 12 hours of the day, and passes the voltage for the second 12 hours of the day.

5. The lighting system claimed in claim 4, wherein for the first 12 hours of the day only the single first light emitting portion is driven, the single first light emitting portion being configured to emit light at a color temperature of 6000K or more, and wherein for the second 12 hours of the day only the single second light emitting portion is driven, the single second light emitting portion being configured to emit light at a color temperature of 3000K or less.

6. The lighting system claimed in claim 3, wherein luminous intensity of the single first light emitting portion and the single second light emitting portion is increased or decreased as the voltage is increased or decreased over time.

7. The lighting system claimed in claim 6, wherein the first controller partially passes the voltage for a first 12 hours of a day, and partially blocks the voltage for a second 12 hours of the day, and wherein the second controller partially blocks the voltage for the first 12 hours of the day, and partially passes the voltage for the second 12 hours of the day.

8. The lighting system claimed in claim 7, wherein for the first 12 hours of the day the single first light emitting portion is driven, the single first light emitting portion being configured to emit light at a color temperature of 6000K or more, wherein for the second 12 hours of the day the single second light emitting portion is driven, the single second light emitting portion being configured to emit light at a color temperature of 3000K or less, and wherein for at least a part of the day both the single first light emitting portion and the single second light emitting portion are driven.

9. The lighting system of claim 1, further comprising a resin separately disposed on the single first light emitting portion and the single second light emitting portion, wherein the phosphor is mixed in the resin disposed on the single first light emitting portion.

10. The lighting system of claim 1, further comprising a resin disposed on the single first light emitting portion and the single second light emitting portion, wherein the resin disposed on the single first light emitting portion is spaced apart from the single second light emitting portion.

11. The lighting system of claim 1, wherein the phosphor comprises an aluminate comprising copper and a rare earth element.

12. The lighting system claimed in claim 11, wherein the aluminate phosphor is expressed by chemical formula 1:

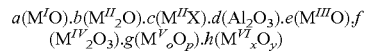

$$a(M^{I}O).b(M^{II}_2O).c(M^{II}X).d(Al_2O_3).e(M^{III}O).f(M^{IV}_2O_3).g(M^{V}_oO_p).h(M^{VI}_xO_y)$$

wherein $M^I$ comprises Cu or Pb and Cu,
wherein $M^{II}$ comprises a monovalent element selected from the group of Li, Na, K, Rb, Cs, Au, and Ag,
wherein $M^{III}$ comprises a divalent element selected from the group of Be, Mg, Ca, Sr, Ba, Zn, Cd, and Mn,
wherein $M^{IV}$ comprises a trivalent element selected from the group of Sc, B, Ga, and In,
wherein $M^V$ comprises an element selected from the group of Si, Ge, Ti, Zr, Mn, V, Nb, Ta, W, and Mo,
wherein $M^{VI}$ comprises at least one element selected from the group of Sc, Y, La, Ce, Pr, Nd, Pm, Sm, Eu, Gd, Tb, Dy, Ho, Er, Tm, Yb, and Lu, and may further comprise Bi, Sn, or Sb,
wherein X comprises an element selected from the group of F, Cl, Br, and I, and wherein $0<a\leq2$, $0\leq b\leq2$, $0\leq c\leq2$, $0<d\leq8$, $0\leq e\leq4$, $0\leq f\leq3$, $0\leq g\leq8$, $1\leq o\leq2$, $1\leq p\leq5$, $0<h\leq2$, $1\leq x\leq2$ and $1\leq y\leq5$.

13. The lighting system claimed in claim 11, wherein the aluminate phosphor is expressed by chemical formula 2:

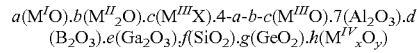

$$a(M^{I}O).b(M^{II}_2O).c(M^{III}X).4-a-b-c(M^{III}O).7(Al_2O_3).d(B_2O_3).e(Ga_2O_3).f(SiO_2).g(GeO_2).h(M^{IV}_xO_y)$$

wherein $M^I$ comprises Cu or Pb and Cu,
wherein $M^{II}$ comprises an element selected from the group of Li, Na, K, Rb, Cs, Au and Ag,
wherein $M^{III}$ comprises an element selected from the group of Be, Mg, Ca, Sr, Ba, Zn, Cd, and Mn,
wherein $M^{IV}$ comprises at least one element selected from the group of Sc, Y, La, In, Ce, Pr, Nd, Pm, Sm, Eu, Gd, Tb, Dy, Ho, Er, Tm, Yb and Lu, and may further comprise Bi, Sn, or Sb, wherein X comprises an element selected from the group of F, Cl, Br and I, and wherein $0 < a \leq 4$, $0 \leq b \leq 2$, $a+b+c \leq 4$, $0 \leq d \leq 1$, $0 < e < 1$, $0 \leq f \leq 1$, $0 \leq h \leq 0.5$, $1 \leq x \leq 2$ and $1 \leq y \leq 5$.

14. The lighting system claimed in claim 11, wherein the aluminate phosphor is expressed by chemical formula 3:

$$a(M^{I}O).b(M^{II}O).c(Al_2O_3).d(M^{III}_2O_3).e(M^{IV}O_2).f(M^{V}_xO_y)$$

wherein $M^{I}$ comprises Cu or Pb and Cu, wherein $M^{II}$ comprises an element selected from the group of Be, Mg, Ca, Sr, Ba, Zn, Cd and Mn, wherein $M^{III}$ comprises an element selected from the group of B, Ga and In, wherein $M^{IV}$ comprises an element selected from the group of Si, Ge, Ti, Zr and Hf, wherein $M^{V}$ comprises at least one element selected from the group of Sc, Y, La, Ce, Pr, Nd, Pm, Sm, Eu, Gd, Tb, Dy, Ho, Er, Tm, Yb and Lu, and may further comprise Bi, Sn, or Sb, and wherein $0 < a \leq 1$, $0 \leq b \leq 2$, $0 < c \leq 8$, $0 \leq d \leq 1$, $0 \leq e \leq 1$, $0 < f \leq 2$, $1 \leq x \leq 2$ and $1 \leq y \leq 5$.

15. The lighting system of claim 1, wherein the first light emitting portion emits daylight with a high color temperature of 6000K or more, and the second light emitting portion emits warm white light at a color temperature of 3000K or less.

* * * * *